US006185265B1

United States Patent
Campanella

(10) Patent No.: US 6,185,265 B1
(45) Date of Patent: Feb. 6, 2001

(54) SYSTEM FOR TIME DIVISION MULTIPLEXING BROADCAST CHANNELS WITH R-1/2 OR R-3/4 CONVOLUTIONAL CODING FOR SATELLITE TRANSMISSION VIA ON-BOARD BASEBAND PROCESSING PAYLOAD OR TRANSPARENT PAYLOAD

(75) Inventor: S. Joseph Campanella, Gaithersburg, MD (US)

(73) Assignee: WorldSpace Management Corp., Washington, DC (US)

(*) Notice: Under 35 U.S.C. 154(b), the term of this patent shall be extended for 0 days.

(21) Appl. No.: 09/055,935

(22) Filed: Apr. 7, 1998

(51) Int. Cl.$^7$ .................................................. H04L 27/06

(52) U.S. Cl. .................................... 375/341; 714/795

(58) Field of Search .......................... 375/341; 370/316, 370/323, 325, 465, 468, 470; 714/786, 795, 756

(56) References Cited

U.S. PATENT DOCUMENTS

| | | | |
|---|---|---|---|
| 3,789,142 | 1/1974 | Shimasaki et al. | 179/15 |
| 4,425,639 | 1/1984 | Acampora et al. | 370/50 |
| 4,480,328 | 10/1984 | Alaria et al. | 370/63 |
| 4,660,196 | 4/1987 | Gray et al. | 370/109 |
| 4,881,241 | 11/1989 | Pommier et al. | |
| 4,901,310 | 2/1990 | Ichiyoshi | 370/75 |
| 4,931,802 | 6/1990 | Assal et al. | 342/356 |
| 5,191,576 | 3/1993 | Pommier et al. | |
| 5,197,061 | 3/1993 | Halbert-Lassalle | 370/11 |
| 5,228,025 | 7/1993 | Le Floch et al. | |
| 5,283,780 | 2/1994 | Schuchman et al. | |
| 5,299,192 | 3/1994 | Guo et al. | 370/70 |
| 5,303,393 | 4/1994 | Noreen et al. | 455/3.2 |
| 5,347,548 | 9/1994 | Messerges | 375/116 |
| 5,416,774 | 5/1995 | Shigematsu | 370/69.1 |
| 5,442,625 | * 8/1995 | Gitlin et al. | 370/342 |
| 5,455,823 | 10/1995 | Noreen et al. | 370/50 |
| 5,473,601 | 12/1995 | Rosen et al. | 370/50 |
| 5,485,464 | 1/1996 | Strodtbeck et al. | 370/95.2 |
| 5,550,812 | 8/1996 | Philips | 370/19 |
| 5,568,483 | * 10/1996 | Padovani et al. | 370/468 |
| 5,625,624 | 4/1997 | Rosen et al. | 370/307 |
| 5,638,408 | * 6/1997 | Takaki | 375/341 |
| 5,689,245 | 11/1997 | Noreen et al. | 340/825.49 |
| 5,898,680 | * 4/1999 | Johnstone et al. | 370/316 |

OTHER PUBLICATIONS

S. Joseph Campanella, "Communications Satellites: Orbiting Into the 90's", *IEEE Spectrum*, pp. 49–52, Aug. 1990.

G. Losquadro, "Digital Audio Broadcasting: High–Grade Service Quality Through On–Board Processing Techniques", *SAT: Satellite Communications*, Jul. 31, 1995, pp. 1–9.

Maral, Gerard, *VSAT Networks*, pp. 52–53 (John Wiley & Sons, Ltd., 1995).

Chitre, D.M., "The Role of Satellite Communications in the ISDN Era", *International Journal of Satellite Communications*, vol. 10, No. 5, Sep.–Oct. 1992, pp. 210–215.

(List continued on next page.)

Primary Examiner—Don N. Vo
(74) Attorney, Agent, or Firm—Roylance, Abrams, Berdo & Goodman

(57) ABSTRACT

A satellite direct radio broadcast system is provided which assembles bits of broadcast programs into prime rate increments, several of which are assembled into a frame. Frames are divided into symbols which are demultiplexed into alternating ones of a plurality of prime rate channels. The broadcast channel frame is encoded for forward error correction (FEC) using an R-½ Viterbi coder or a R-¾ Viterbi coder, depending on the desired bit rate for a time division multiplexed (TDM) stream comprising the broadcast channel. A broadcast station is configured to format FEC-encoded broadcast channel frames into TDM frames when transmission of the TDM frames by a transparent payload on-board a satellite is used.

7 Claims, 25 Drawing Sheets

OTHER PUBLICATIONS

Chitre, D.M. et al, "Architectures for the Intelsat NISDN–Compatible Satellite Communications Network", *International Journal of Satellite Communications*, vol. 10, pp. 217–225 (1992).

Digital Audio Broadcast, Stanford Telecom, STEL–VPR–0538, Apr. 1991.

Proceedings from Second International Symposium on Digital Audio Broadcasting: the Sound of 2000, Toronto, Canada, Mar. 14–17, 1994, vol. II, pp. 63–108 and pp. 240–248.

Principles for the Guidance of EBU Members for WARC–92 Broadcasting–Satellite Service, European Broadcasting Union, Feb. 1991 Draft SPB 483–E, pp. 1–75.

Annex C to ITU–R Special Publication on Terrestrial and Satellite Digital Sound Broadcasting to Vehicular Portable and Fixed Receivers in the VHF/UHF Bands on "Digital System B", Nov. 1, 1994.

Amendment to Communications Subsystem in Application of Satellite CD Radio Inc. before the Federal Communications Commission, pp. 1–16.

The Eureka 147 Project, Digital Audio Broadcasting System, DAB Project Office, Germany, pp. 1–11.

Advanced Digital Techniques for UHF Satellite Sound Broadcasting: Collected Papers on Concepts for Sound Broadcasting Into the 21st Century; European Broadcasting Union, Extracted from EBU Document SPB 442, Jan. 1998, pp. 11–69.

Le Floch et al; Digital Sound Broadcasting to Mobile Receivers, IEEE Transactions on Consumer Electronics, Aug. 1989, vol. 35, No. 3, pp. 493–503.

\* cited by examiner

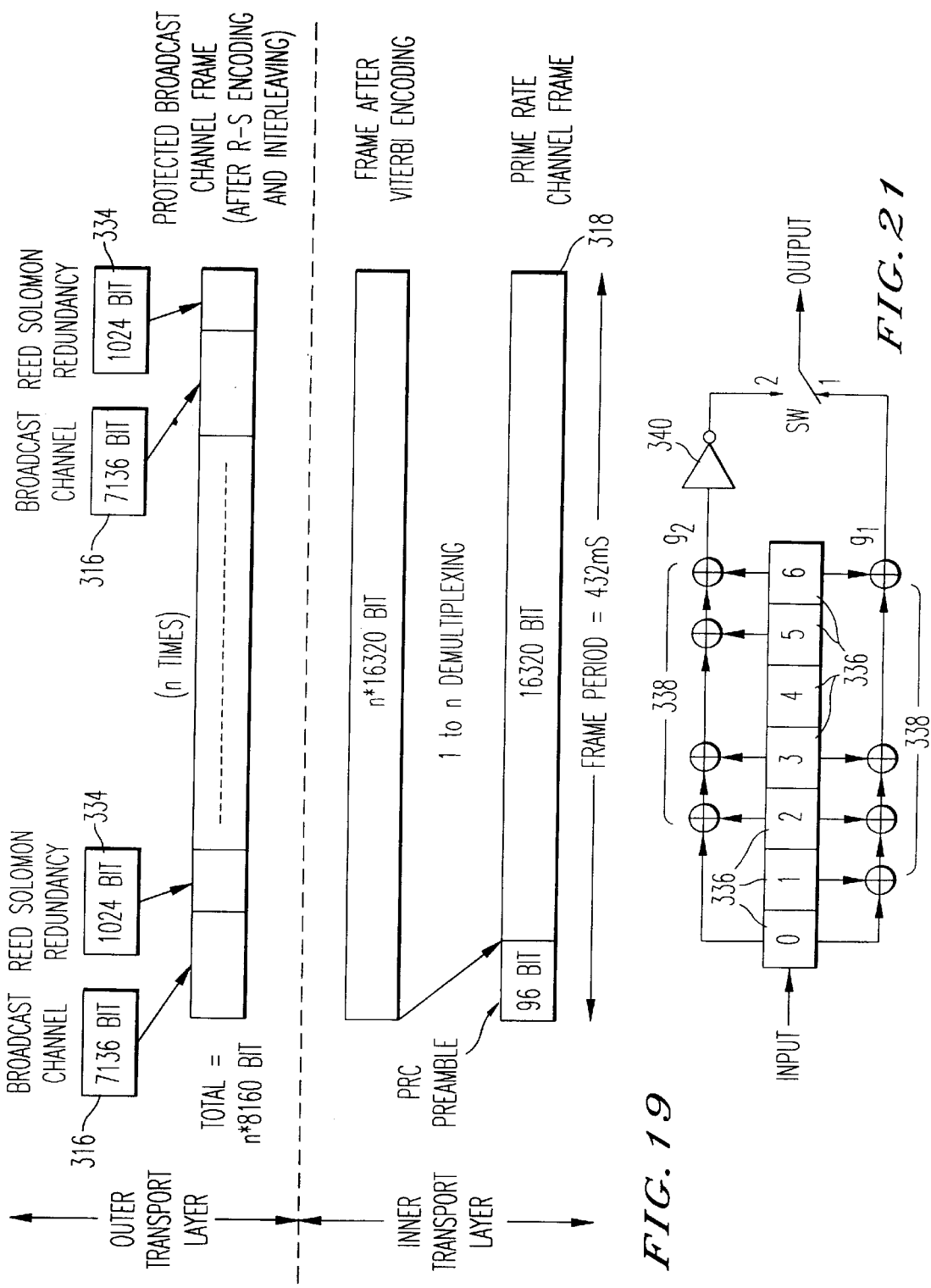

US 6,185,265 B1

SYSTEM FOR TIME DIVISION MULTIPLEXING BROADCAST CHANNELS WITH R-1/2 OR R-3/4 CONVOLUTIONAL CODING FOR SATELLITE TRANSMISSION VIA ON-BOARD BASEBAND PROCESSING PAYLOAD OR TRANSPARENT PAYLOAD

CROSS REFERENCE TO RELATED APPLICATION

Related subject matter is disclosed and claimed in co-pending U.S. patent application Ser. No. 08/971,049, filed Nov. 14, 1997, the entire subject matter of which is hereby incorporated herein by reference for all purposes. Related subject matter is also disclosed and claimed in U.S. patent application Ser. No. 08/569,346, filed by S. Joseph Campanella on Dec. 8, 1995, now U.S. Pat. No. 5,835,487, which is also being expressly incorporated herein by reference.

FIELD OF INVENTION

The invention relates to a system for coding broadcast channels using R-½ or R-¾ convolutional coders for satellite transmission via an on-board baseband processing payload or a transparent payload, respectively, and formatting R-½ or R-¾ convolutional coded broadcast channel frames into TDM frames for transmission via a selected one of the L-band or the S-band.

BACKGROUND OF THE INVENTION

There presently exists a population of over 4 billion people that are generally dissatisfied and underserved by the poor sound quality of short-wave radio broadcasts, or the coverage limitations of amplitude modulation (AM) band and frequency modulation (FM) band terrestrial radio broadcast systems. This population is primarily located in Africa, Central and South America, and Asia. A need therefore exists for a satellite-based direct radio broadcast system to transmit signals such as audio, data and images to low-cost consumer receivers.

A number of satellite communications networks have been developed for commercial and military applications. These satellite communications systems, however, have not addressed the need to provide multiple, independent broadcast service providers with flexible and economical access to a space segment, nor consumers' need to receive high quality radio signals using low-cost consumer radio receiver units. A need therefore exists for providing service providers with direct access to a satellite and choices as to the amount of space segment that's purchased and used. In addition, a need exists for a low-cost radio receiver unit capable of receiving time division multiplexed downlink bit streams.

SUMMARY OF THE INVENTION

In accordance with an aspect of the present invention, a broadcast station generates prime rate channels for broadcast transmission to radio receivers via a TDM bit stream whereby a broadcast channel frame is encoded for forward error correction (FEC) using a concatenated coding scheme. A Reed-Solomon coder is concatenated with an interleaver, and then with an R-¾ Viterbi coder. The FEC-encoded broadcast channel frame is then demultiplexed into prime rate channels that are formatted for transmission via a time division multiplexed bit stream.

In accordance with another aspect of the present invention, a system for formatting a signal for broadcast transmission to remote receivers is provided whereby a broadcast station generates a TDM bit stream from broadcast channels for transmission to radio receivers via transparent "bent-pipe" payloads on-board a satellite.

BRIEF DESCRIPTION OF THE DRAWINGS

These and other features and advantages of the present invention will be more readily comprehended from the following detailed description when read in connection with the appended drawings, which form a part of this original disclosure, and wherein:

FIG. 19 is a diagram of a broadcast channel frame in the outer transport layer depicted in FIG. 18, and a prime rate channel frame in the inner transport layer as depicted in FIG. 18;

FIG. 21 is a schematic diagram of a Viterbi encoder for broadcast channels used on the inner transport layer of the broadcast segment in accordance with an embodiment of the present invention;

DETAILED DESCRIPTION OF THE PREFERRED EMBODIMENTS

Overview

Figure 1:
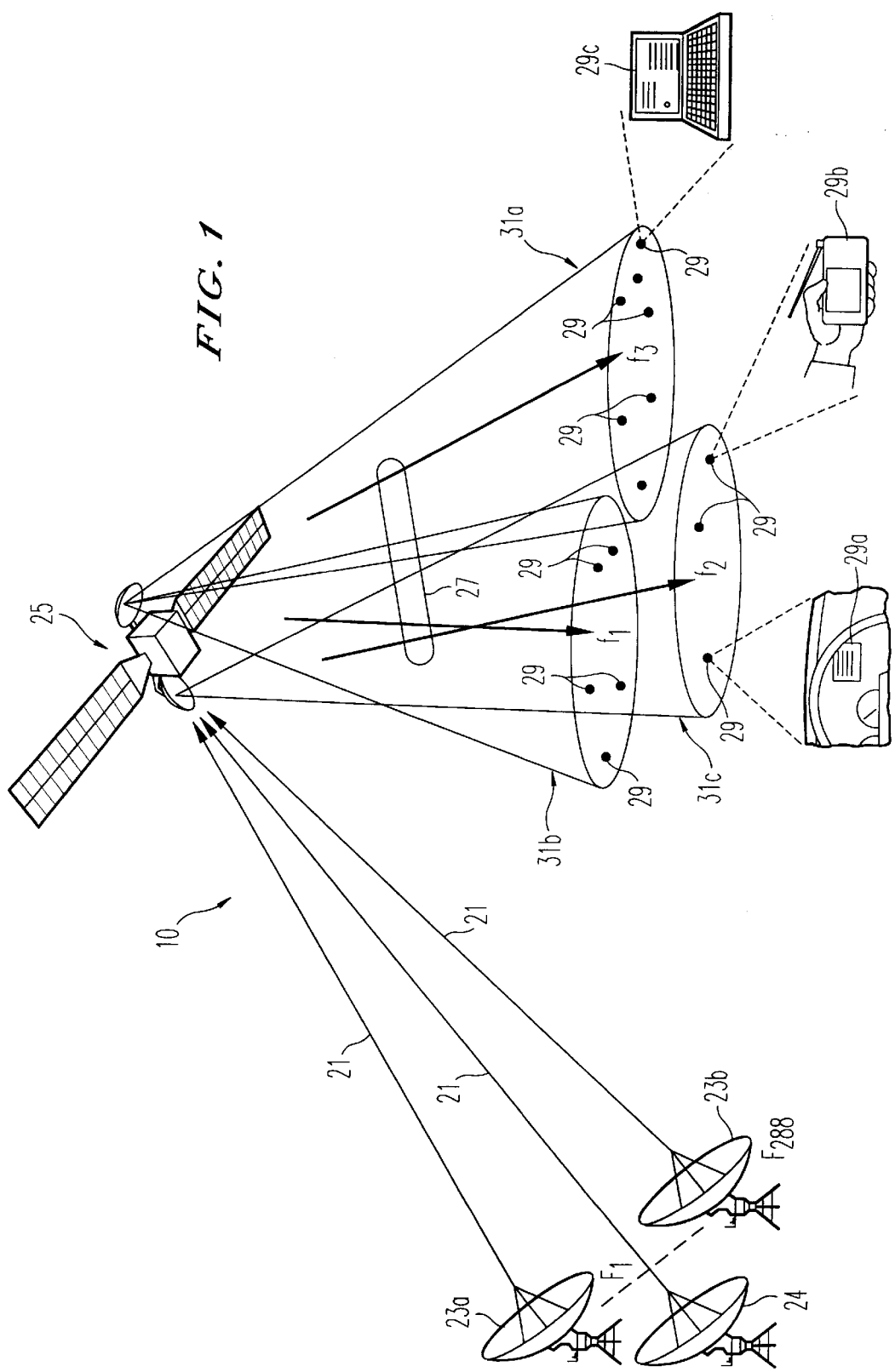
FIG. 1 is a schematic diagram of a satellite direct broadcast system constructed in accordance with an embodiment of the present invention.

In accordance with the present invention, a satellite-based radio broadcast system 10 is provided to broadcast programs via a satellite 25 from a number of different broadcast stations 23a and 23b (hereinafter referred to generally as 23), as shown in FIG. 1. Users are provided with radio receivers, indicated generally at 29, which are designed to receive one or more time division multiplexed (TDM) L-band carriers 27 downlinked from the satellite 25 that are modulated at 1.86 Megasymbols per second (Msym/s). The user radios 29 are designed to demodulate and demultiplex the TDM carrier to recover bits that constitute the digital information content or program transmitted on broadcast channels from the broadcast stations 23. In accordance with an embodiment of the invention, the broadcast stations 23 and the satellite 25 are configured to format uplink and downlink signals to allow for improved reception of broadcast programs using relatively low cost radio receivers. A radio receiver can be a mobile unit 29a mounted in a transportation vehicle, for example, a hand-held unit 28b or a processing terminal 29c with a display.

Although only one satellite 25 is shown in FIG. 1 for illustrative purposes, the system 10 preferably comprises three geostationary satellites 25a, 25b and 25c (FIG. 12) configured to use frequency bands of 1467 to 1492 Megahertz (MHz) which has been allocated for broadcasting satellite service (BSS) direct audio broadcast (DAB). The broadcast stations 23 preferably use feeder uplinks 21 in the X-band, that is from 7050 to 7075 MHz. Each satellite 25 is preferably configured to operate three downlink spot beams indicated at 31a, 31b and 31c. Each beam covers approximately 14 million square kilometers within power distribution contours that are four decibels (dB) down from beam center and 28 million square kilometers within contours that are eight dB down. The beam center margin can be 14 dB based on a receiver gain-to-temperature ratio of −13 dB/K.

With continued reference to FIG. 1, the uplink signals 21 generated from the broadcast stations 23 are modulated in frequency division multiple access (FDMA) channels from the ground stations 23 which are preferably located within the terrestrial visibility of the satellite 25. Each broadcast station 23 preferably has the ability to uplink directly from its own facilities to one of the satellites and to place one or more 16 kilobit per second (kbps) prime rate increments on a single carrier. Use of FDMA channels for uplink allows for a significant amount of flexibility for sharing the space segment among multiple independent broadcast stations 23 and significantly reduces the power and hence the cost of the uplink earth stations 23. Prime rate increments (PRIs) of 16 kilobits per second (kbps) are preferably the most fundamental building block or rudimentary unit used in the system 10 for channel size and can be combined to achieve higher bit rates. For example, PRIs can be combined to create program channels with bit rates up to 128 kbps for near compact disc quality sound or multimedia broadcast programs comprising image data, for example.

Conversion between uplink FDMA channels and downlink multiple channel per carrier/time division multiplex (MCPC/TDM) channels is achieved on-board each satellite 25 at the baseband level. As will be described in further detail below, prime rate channels transmitted by a broadcast station 23 are demultiplexed at the satellite 25 into individual 16 kbps baseband signals. The individual channels are then routed to one or more of the downlink beams 31a, 31b and 31c, each of which is a single TDM stream per carrier signal. This baseband processing provides a high level of channel control in terms of uplink frequency allocation and channel routing between uplink FDMA and downlink TDM signals.

Figure 2:
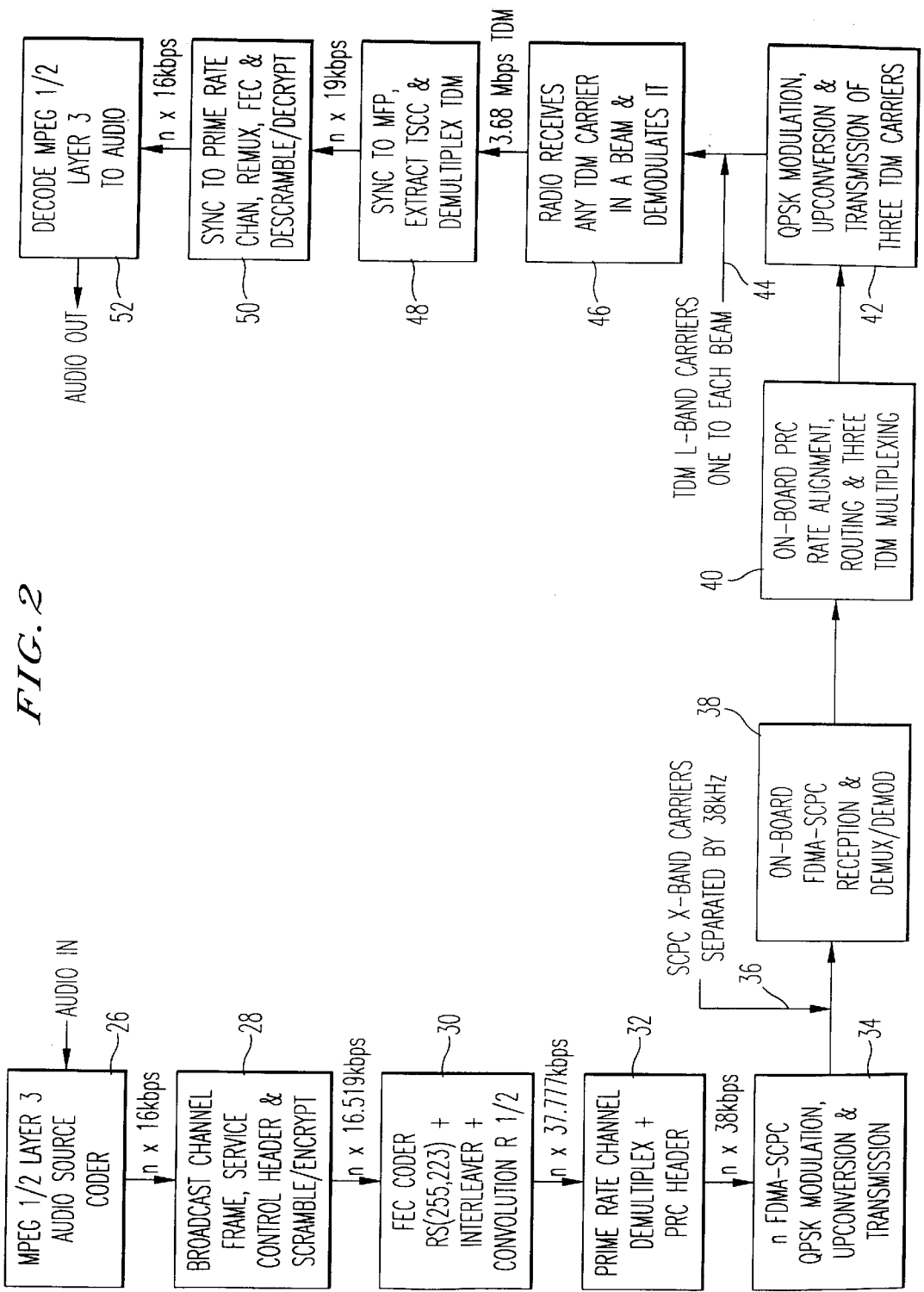
FIG. 2 is a flow chart depicting the sequence of operations for end-to-end signal processing in the system depicted in FIG. 1 in accordance with an embodiment of the present invention.

The end-to-end signal processing that occurs in the system 10 is described with reference to FIG. 2. The system components responsible for the end-to-end signal processing is described in further detail below with reference to FIGS. 3–11. As shown in FIG. 2, audio signals from an audio source, for example, at a broadcast station 23, are preferably coded using MPEG 2.5 Layer 3 coding (block 26). The digital information assembled by a broadcast service provider at a broadcast station 23 is preferably formatted in 16 kbps increments or PRIs where n is the number of PRIs purchased by the service provider (i.e., n×16 kbps). The digital information is then formatted into a broadcast channel frame having a service control header (SCH) (block 28), described in further detail below. A periodic frame in the system 10 preferably has a period duration of 432 milliseconds (ms). Each frame is preferably assigned n×224 bits for the SCH such that the bit rate becomes approximately n×16.519 kbps. Each frame is next scrambled by addition of a pseudorandom bit stream to the SCH. Information control of the scrambling pattern by a key permits encryption. The bits in a frame are subsequently coded for forward error correction (FEC) protection using preferably two concatenated coding methods such as the Reed Solomon method, followed by interleaving, and then convolution coding (e.g., trellis convolution coding described by Viterbi) (block 30). The coded bits in each frame corresponding to each PRI are subsequently subdivided or demultiplexed into n parallel prime rate channels (PRCs) (block 32). To implement recovery of each PRC, a PRC synchronization header is provided. Each of the n PRCs is next differentially encoded and then modulated using, for example, quadrature phase shift keying modulation onto an intermediate frequency (IF) carrier frequency (block 34). The n PRC IF carrier frequencies constituting the broadcast channel of a broadcast station 23 is converted to the X-band for transmission to the satellite 25, as indicated by the arrow 36.

The carriers from the broadcast stations 23 are single channel per carrier/frequency division multiple access (SCPC/FDMA) carriers. On-board each satellite 25, the SCPC/FDMA carriers are received, demultiplexed and demodulated to recover the PRC carriers (block 38). The PRC digital baseband channels recovered by the satellite 25 are subjected to a rate alignment function to compensate for clock rate differences between the on-board satellite clock and that of the PRC carriers received at the satellite (block 40). The demultiplexed and demodulated digital streams obtained from the PRCs are provided to TDM frame assemblers using routing and switching components. The PRC digital streams are routed from demultiplexing and demodulating equipment on-board the satellite 25 to the TDMA frame assemblers in accordance with a switching sequence unit on-board the satellite that is controlled from an earth station via a command link (e.g., a satellite control center 236 in FIG. 12 for each operating region). Three TDM carriers are created which correspond to each of the three satellite beams 31a, 31b and 31c (block 42). The three TDM carriers are up converted to L-band frequencies following QPSK modulation, as indicated by arrow 44. Radio receivers 29 are configured to receive any of the three TDM carriers and to demodulate the received carrier (block 46). The radio receivers 29 are designed to synchronize a TDM bit stream using a master frame preamble provided during on-board satellite processing (block 48). PRCs are demultiplexed from the TDM frame using a Time Slot Control Channel (TSCC), as well. The digital streams are then remultiplexed into the FEC-coded PRC format described above with reference to block 30 (block 50). The FEC processing preferably includes decoding using a Viterbi trellis decoder, for example, deinterleaving, and then Reed Solomon decoding to recover the original broadcast channel comprising n×16 kbps channel and the SCH. The n×16 kbps segment of the broadcast channel is supplied to an MPEG 2.5 Layer 3 source decoder for conversion back to audio. In accordance with the present invention, the audio output is available via a very low cost broadcast radio receiver 27 due to the processing and TDM formatting described above in connection with the broadcast station(s) 23 and the satellite 25 (block 52).

Uplink Multiplexing and Modulation

Signal processing to convert data streams from one or more broadcast stations 23 into parallel streams for transmission to a satellite 25 will now be described with reference to FIG. 3. For illustrative purposes, four sources 60, 64, 68, and 72 of program information are shown. Two sources 60 and 64, or 68 and 72, are coded and transmitted together as part of a single program or service. The coding of the program comprising combined audio sources 60 and 64 will be described. The signal processing of the program comprising digital information from sources 68 and 72 is identical.

As stated previously, broadcast stations 23 assemble information from one or more sources 60 and 64 for a particular program into broadcast channels characterized by increments of 16 kbps. These increments are referred to as prime rate increments or PRIs. Thus, the bit rate carried in a broadcast channel is n×16 kbps were n is the number of PRIs used by that particular broadcast service provider. In addition, each 16 kbps PRI can be further divided into two 8 kbps segments which are routed or switched together through the system 10. The segments provide a mechanism for carrying two different service items in the same PRI such as a data stream with low bit rate speech signals, or two low bit rate speech channels for two respective languages, and so on. The number of PRIs are preferably predetermined, that is, set in accordance with program code. The number n, however, is not a physical limitation of the system 10. The value of n is generally set on the basis of business concerns such as the cost of a single broadcast channel and the willingness of the service providers to pay. In FIG. 3, n for the first broadcast channel 59 for sources 60 and 64 is equal to 4. The value of n for the broadcast channel 67 for sources 68 and 72 is set to 6 in the illustrated embodiment.

Figure 3:
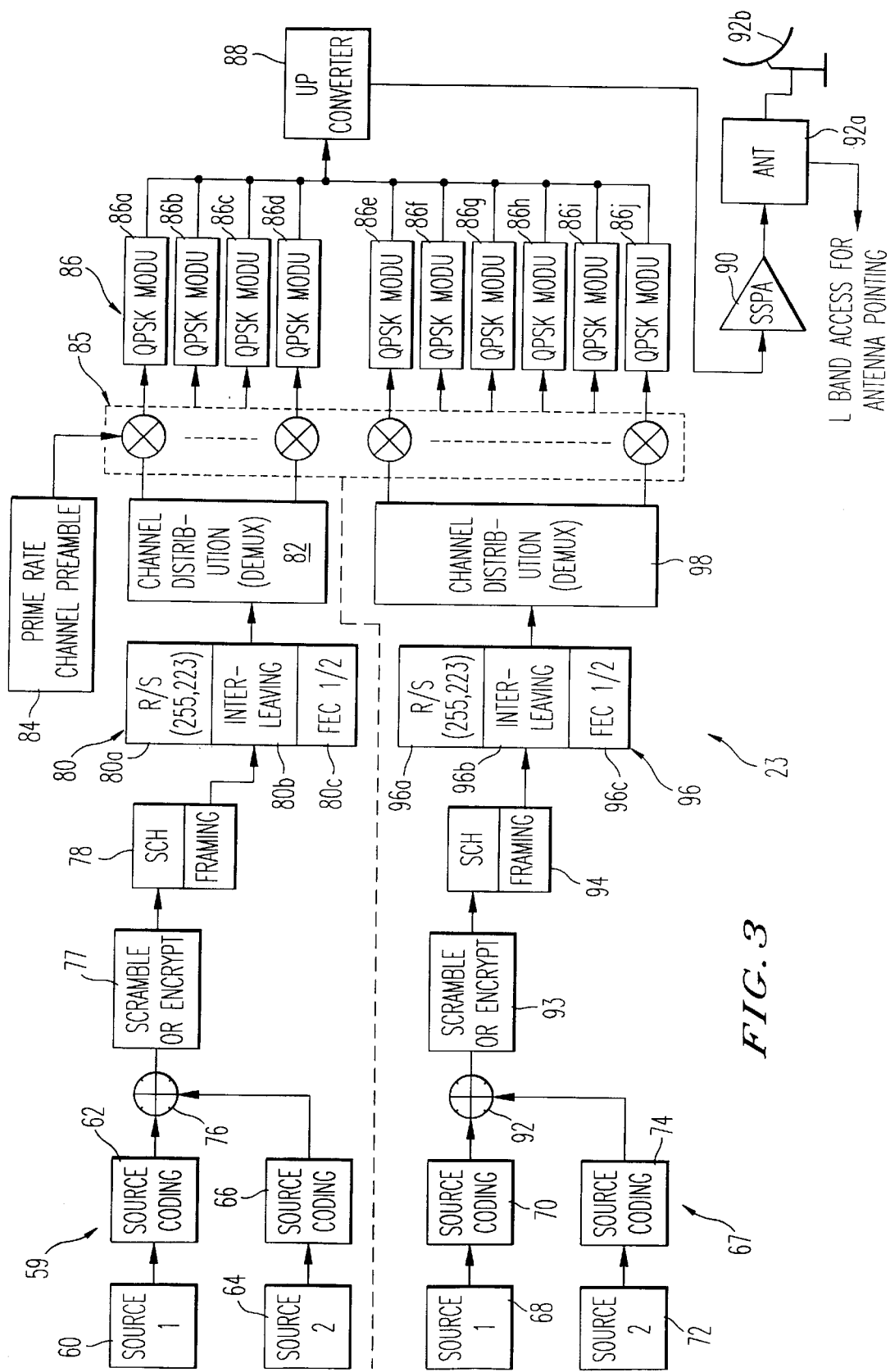
FIG. 3 is a schematic block diagram of a broadcast earth station constructed in accordance with an embodiment of the present invention.

As shown in FIG. 3, more than one broadcast service provider can have access to a single broadcast station 23. For example, a first service provider generates broadcast channel 59, while a second service provider can generate broadcast channel 67. The signal processing described herein and in accordance with the present invention allows data streams from several broadcast service providers to be broadcast to a satellite in parallel streams which reduces the cost of broadcasting for the service providers and maximizes use of the space segment. By maximizing efficiency of space segment usage, the broadcast stations 23 can be implemented less expensively using less power-consuming components. For example, the antenna at the broadcast station 23 can be very small aperture terminal (VSAT) antenna. The payload on the satellite requires less memory, less processing capability and therefore fewer power sources which reduces payload weight.

Figure 4:
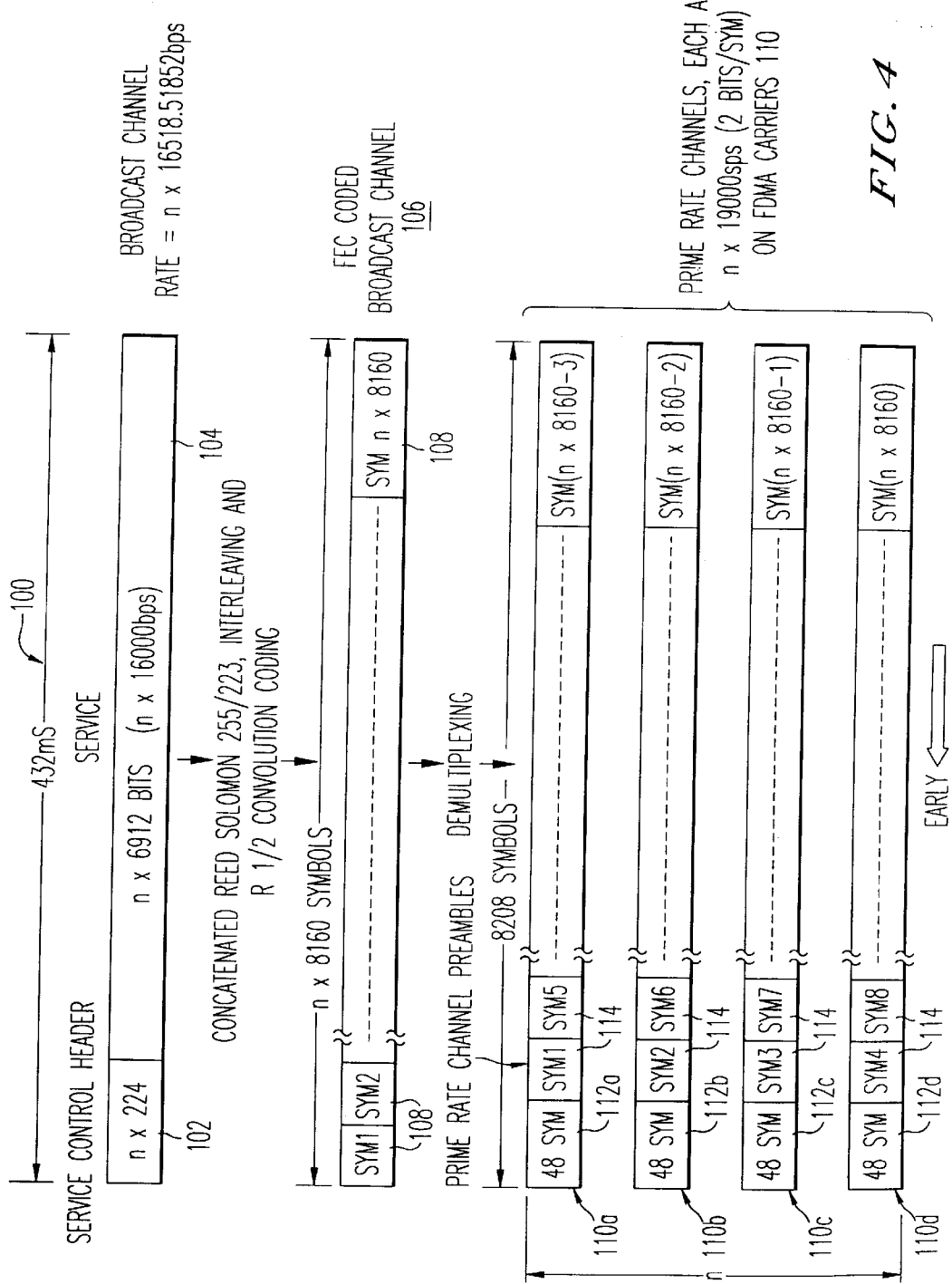
FIG. 4 is a schematic diagram illustrating broadcast segment multiplexing in accordance with an embodiment of the present invention.

A broadcast channel 59 or 67 is characterized by a frame 100 having a period duration of 432 ms, as shown in FIG. 4. This period duration is selected to facilitate use of the MPEG source coder described below; however, the frame paired in the system 10 can be set to a different predetermined value. If the period duration is 432 ms, then each 16 kbps PRI requires 16,000×0.432 seconds=6912 bits per frame. As shown in FIG. 4, a broadcast channel therefore consists of a value n of these 16 kbps PRIs which are carried as a group in the frame 100. As will be described below, these bits are scrambled to enhance demodulation at the radio receivers 29. The scrambling operation also provides a mechanism for encrypting the service at the option of the service provider. Each frame 100 is assigned n×224 bits which correspond to a service control header (SCH), resulting in a total of n×7136 bits per frame and a bit rate of n×(16,518+14\27) bits per second. The purpose of the SCH is to send data to each of the radio receivers 29 tuned to receive the broadcast channel 59 or 67 in order to control reception modes for various multimedia services, to display data and images, to send key information for decryption, to address a specific receiver, among other features.

With continued reference to FIG. 3, the sources 60 and 64 are coded using, for example, MPEG 2.5 Layer 3 coders 62 and 66, respectively. The two sources are subsequently added via a combiner 76 and then processed using a processor at the broadcast station 23 to provide the coded signals in periodic frames of 432 ms, that is, n×7136 bits per frame including the SCH, as indicated by processing module 78 in FIG. 3. The blocks indicated at the broadcast station in FIG. 3 correspond to programmed modules performed by a processor and associated hardware such as digital memory and coder circuits. The bits in the frame 100 are subsequently coded for FEC protection using digital signal processing (DSP) software, application specific integrated circuits (ASICs) and custom large-scale integration (LSI) chips for the two concatenated coding methods. First, a Reed Solomon coder 80$a$ is provided to produce 255 bits for every 223 bits entering the coder. The bits in the frame 100 are then reordered according to a known interleaving scheme, as indicated by reference number 80$b$. The interleaving coding provides further protection against bursts of error encountered in a transmission since this method spreads damaged bits over several channels. With continued reference to processing module 80, a known convolution coding scheme of constraint length 7 is applied using a Viterbi coder 80$c$. The Viterbi coder 83$c$ produces two output bits for every input bit, producing as a net result 16320 FEC-coded bits per frame for each increment of 6912 bits per frame applied in the broadcast channel 59. Thus, each FEC-coded broadcast channel (e.g., channel 59 or 67) comprises n×16320 bits of information which have been coded, reordered and coded again such that the original broadcast 16 kbps PRIs are no longer identifiable. The FEC-coded bits, however, are organized in terms of the original 432 ms frame structure. The overall coding rate for error protection is (255/223)×2=2+64/223.

With continued reference to FIG. 3, the n×16320 bits of the FEC-coded broadcast channel frame is subsequently subdivided or demultiplexed using a channel distributor 82 into n parallel prime rate channels (PRCs), each carrying 16320 bits in terms of sets of 8160 two-bit symbols. This process is further illustrated in FIG. 4. The broadcast channel 59 is shown which is characterized by a 432 ms frame 100 having an SCH 102. The remaining portion 104 of the frame consists of n 16 kbps PRIs which corresponds to 6912 bits per frame for each of the n PRIs. The FEC-coded broadcast channel 106 is attained following concatenated Reed Solomon 255/223, interleaving and FEC 1/2 convolution coding described above in connection with module 80. As stated previously, the FEC-coded broadcast channel frame 106 comprises n×16320 bits which correspond to 8160 sets of two-bit symbols, with each symbol being designated by a reference numeral 108 for illustrated purposes. In accordance with the present invention, the symbols are assigned across the PRCs 110 in the manner shown in FIG. 4. Thus, the symbols will be spread on the basis of time and frequency which further reduces errors at the radio receiver caused by interference in transmission. The service provider for broadcast channel 59 has purchased four PRCs for illustrative purposes, whereas the service provider for broadcast channel 67 has purchased six PRCs for illustrative purposes. FIG. 4 illustrates the first broadcast channel 59 and the assignment of symbols 114 across the n=4 PRCs 110$a$, 110$b$, 110$c$ and 110$d$, respectively. To implement recovery of each two-bit symbol 114 set at the receiver, a PRC synchronization header or preamble 112$a$, 112$b$, 112$c$ and 112$d$, respectively, is placed in front of each PRC. The PRC synchronization header (hereinafter generally referred to using reference numeral 112) contains 48 symbols. The PRC synchronization header 112 is placed in front of each group of 8160 symbols, thereby increasing the number of symbols per 432 ms frame to 8208 symbols. Accordingly, the symbol rate becomes 8208/0.432 which equals 19,000 kilosymbols per second (ksym/s) for each PRC 110. The 48 symbol PRC preamble 112 is used essentially for synchronization of the radio receiver PRC clock to recover the symbols from the downlink satellite transmission 27. At the on-board processor 116, the PRC preamble is used to absorb timing differences between the symbol rates of arriving uplink signals and that used on-board to switch the signals and assemble the downlink TDM streams. This is done by adding, subtracting a "0" or neither to each 48 symbol PRC in the rate alignment process used on-board the satellite. Thus, the PRC preambles carried on the TDM downlink has 47, 48 or 49 symbols as determined by the rate alignment process. As shown in FIG. 4, symbols 114 are assigned to consecutive PRCs in a round-robin fashion such that symbol 1 is assigned to PRC 110$a$, symbol 2 is assigned to PRC 110$b$, symbol 3 is assigned to PRC 110$c$, symbol 4 is assigned to PRC 110$d$, symbol 5 is assigned to PRC 110$e$, and so on. This PRC demultiplexing process is performed by a processor at the broadcast station 23 and is represented in FIG. 3 as the channel distribution (DEMUX) module 82.

The PRC channel preambles are assigned to mark the beginning of the PRC frames 110$a$, 110$b$, 110$c$ and 110$d$ for broadcast channel 59 using the preamble module 84 and adder module 85. The n PRCs are subsequently differentially encoded and then QPSK modulated onto an IF carrier frequency using a bank of QPSK modulators 86 as shown in FIG. 3. Four of the QPSK modulators 86$a$, 86$b$, 86$c$ and 86$d$ are used for respective PRCs 110$a$, 110$b$, 110$c$ and 110$d$ for broadcast channel 59. Accordingly, there are four PRC IF carrier frequencies constituting the broadcast channel 59. Each of the four carrier frequencies is up converted to its assigned frequency location in the X-band using an up-converter 88 for transmission to the satellite 25. The up-converted PRCs are subsequently transmitted through an amplifier 90 to the antenna (e.g., a VSAT) 91$a$ and 91$b$.

In accordance with the present invention, the transmission method employed at a broadcast station 23 incorporates a multiplicity of n Single Channel Per Carrier, Frequency Division Multiple Access (SCPC/FDMA) carriers into the uplink signal 21. These SCPC/FDMA carriers are spaced on a grid of center frequencies which are preferably separated by 38,000 Hertz (Hz) from one another and are organized in groups of 48 contiguous center frequencies or carrier channels. Organization of these groups of 48 carrier channels is useful to prepare for demultiplexing and demodulation processing conducted on-board the satellite 25. The various groups of 48 carrier channels are not necessarily contiguous to one another. The carriers associated with a particular broadcast channel (i.e., channel 59 or 67) are not necessarily contiguous within a group of 48 carrier channels and need not be assigned in the same group of 48 carrier channels. The transmission method described in connection with FIGS. 3 and 4 therefore allows for flexibility in choosing frequency locations and optimizes the ability to fill the available frequency spectrum and to avoid interference with other users sharing the same radio frequency spectrum.

The system 10 is advantageous because it provides a common base of capacity incrementation for a multiplicity of broadcast companies or service providers whereby broadcast channels of various bit rates can be constructed with relative ease and transmitted to a receiver 29. Typical broadcast channel increments or PRIs are preferably 16, 32, 48, 64, 80, 96, 112 and 128 kbps. The broadcast channels of various bit rates are interpreted with relative ease by the radio's receiver due to the processing described in connection with FIG. 4. The size and cost of a broadcast station can therefore be designed to fit the capacity requirements and financial resource limitations of a broadcast company. A broadcast company of meager financial means can install a small VSAT terminal requiring a relatively small amount of power to broadcast a 16 kbps service to its country that is sufficient to carry voice and music having quality far better than that of short-wave radio. On the other hand, a sophisticated broadcast company of substantial financial means can broadcast FM stereo quality with a slightly larger antenna and more power at 64 kbps and, with further increases in capacity, broadcast near compact disc (CD) stereo quality at 96 kbps and full CD stereo quality at 128 kbps.

The frame size, SCH size, preamble size and PRC length described in connection with FIG. 4 are used to realize a number of advantages; however, the broadcast station processing described in connection with FIGS. 3 and 4 is not limited to these values. The frame period of 432 ms is convenient when using an MPEG source coder (e.g., coder 62 or 66). The 224 bits for each SCH 102 is selected to facilitate FEC coding. The 48 symbol PRC preamble 112 is selected to achieve 8208 symbols per PRC 110 to achieve 19,000 ksym/s for each PRC for a simplified implementation of multiplexing and demultiplexing on-board the satellite 25, as described in future detail below. Defining symbols to comprise two-bits is convenient for QPSK modulation (i.e., $2^2=4$). To illustrate further, if phase shift key modulation at the broadcast station 23 uses eight phases as opposed to four phases, then a symbol defined as having three bits would be more convenient since each combination of three bits (i.e., $2^3$) can correspond to one of the eight phases.

Software can be provided at a broadcast station 23 or, if more than one broadcast station exists in the system 10, a regional broadcast control facility (RBCF) 238 (FIG. 12) to assign space segment channel routing via a mission control center (MCC) 240, a satellite control center (SCC) 236 and a broadcast control center (BCC) 244. The software optimizes use of the uplink spectrum by assigning PRC carrier channels 110 wherever space is available in the 48 channel groups. For example, a broadcast station may wish to broadcast a 64 kbps service on four PRC carriers. Due to current spectrum use, the four carriers may not be available in contiguous locations, but rather only in non-contiguous locations within a group of 48 carriers. Further, the RBCF 238 using its MCC and SCC may assign the PRCs to non-contiguous locations among different 48 channel groups. The MCC and SCC software at the RBCF 238 or a single broadcast station 23 can relocate PRC carriers of a particular broadcast service to other frequencies to avoid deliberate (i.e., jamming) or accidental interference on specific carrier locations. A current embodiment of the system has three RBCFs, one for each of the three regional satellites. Additional satellites can be controlled by one of these three facilities.

As will be described in further detail below in connection with on-board satellite processing in FIG. 6, an on-board digitally implemented polyphase processor is used for on-board signal regeneration and digital baseband recovery of the symbols 114 transmitted in the PRCs. The use of groups of 48 carriers spaced on center frequencies separated by 38,000 Hz facilitates processing by the polyphase processor. The software available at the broadcast station 23 or RBCF 238 can perform defragging, that is, defragmentation processing to optimize PRC 110 assignments to uplink carrier channels, that is, groups of 48 carrier channels. The principal behind defragmentation of uplink carrier frequency assignments is not unlike known software for reorganizing files on a computer hard drive which, over time, have been saved in such a piece-meal manner as to be inefficient for data storage. The BCC functions at the RBCF allows the RBCF to remotely monitor and control broadcast stations to assure their operation within assigned tolerances.

Satellite Payload Processing

Figure 5:
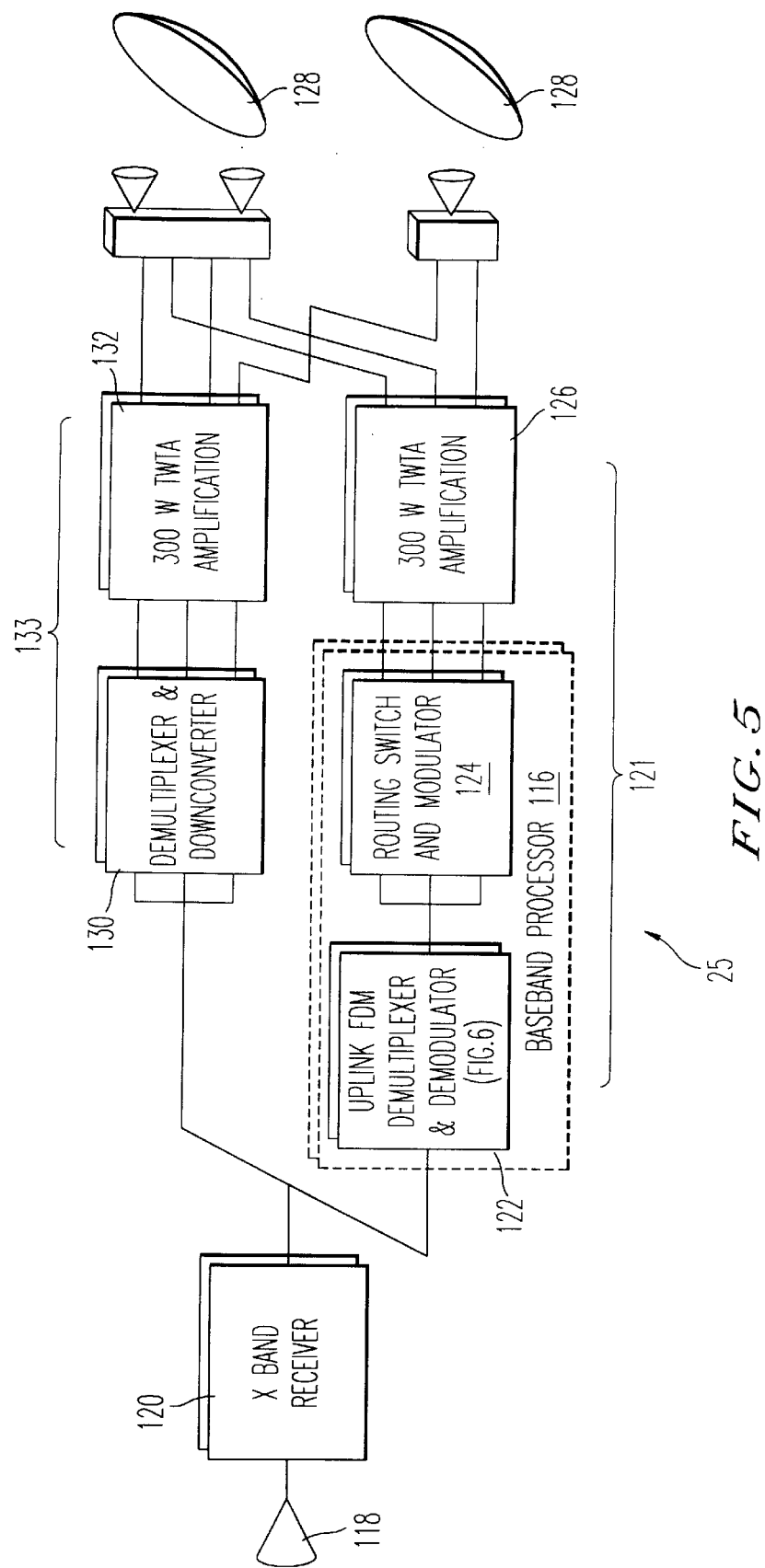
FIG. 5 is a schematic block diagram of an on-board processing payload for a satellite in accordance with an embodiment of the present invention.

The baseband recovery on the satellite is important for accomplishing on-board switching and routing and assembly of TDM downlink carriers, each having 96 PRCs. The TDM carriers are amplified on-board the satellite 25 using single-carrier-per-traveling-wave-tube operation. The satellite 25 preferably comprises eight on-board baseband processors; however, only one processor 116 is shown. Preferably only six of the eight processors are used at a time, the remainder providing redundancy in event of failures and to command them to cease transmission if circumstances require such. A single processor 116 is described in connection with FIGS. 6 and 7. It is to be understood that identical components are preferably provided for each of the other seven processors 116. With reference to FIG. 5, the coded PRC uplink carriers 21 are received at the satellite 25 by an X-band receiver 120. The overall uplink capacity is preferably between 288 and 384 PRC uplink channels of 16 kbps each (i.e., 6×48 carriers if six processors 116 are used, or 8×48 carriers if all eight processors 116 are used). As will be described in further detail below, 96 PRCs are selected and multiplexed for transmission in each downlink beam 27 onto a carrier of approximately 2.5 MHz bandwidth.

Each uplink PRC channel can be routed to all, some or none of the downlink beams 27. The order and placement of PRCs in a downlink beam is programmable and selectable from a telemetry, range and control (TRC) facility 24 (FIG. 1). Each polyphase demultiplexer and demodulator 122 receives the individual FDMA uplink signals in groups of 48 contiguous channels and generates a single analog signal on which the data of the 48 FDMA signals is time multiplexed, and performs a high speed demodulation of the serial data as described in further detail below in connection with FIG. 6. Six of these polyphase demultiplexer and demodulators 122 operate in parallel to process 288 FDMA signals. A routing switch and modulator 124 selectively directs individual channels of the six serial data streams into all, some or none of the downlink signals 27 and further modulates and up-converts the three downlink TDM signals 27. Three traveling wave tube amplifiers (TWTA) 126 individually amplify the three downlink signals, which are radiated to the earth by L-band transmit antennas 128.

The satellite 25 also contains three transparent payloads, each comprising a demultiplexer and down-converter 130 and an amplifier group 132 configured in a conventional "bent pipe" signal path which converts the frequency of input signals for retransmission. Thus, each satellite 25 in the system 10 is preferably equipped with two types of communication payloads. The first type of on-board processing payload is described with reference to FIGS. 5, 6 and 7. The second type of communication payload is the transparent payload which converts uplink TDM carriers from frequency locations in the uplink X-band spectrum to frequency locations in the L-band downlink spectrum. The transmitted TDM stream for the transparent payload is assembled at a broadcast station 23, sent to the satellite 25, received and frequency converted to a downlink frequency location using module 130, amplified by a TWTA in module 132 and transmitted to one of the beams. To a radio receiver 29, the TDM signals appear identical whether they are from the on-board processing payload indicated at 121 or the transparent payload indicated at 133. The carrier frequency locations of each type of payload 121 and 133 are spaced on separate grids of 920 kHz spacing which are interlaced between one another in a bisected manner so that the carrier locations of a mix of signals from both types of payloads 121 and 133 are on 460 kHz spacings.

The on-board demultiplexer and demodulator 122 will now be described in further detail with reference to FIG. 6. As shown in FIG. 6, SCPC/FDMA carriers, each of which is designated with reference numeral 136, are assigned to groups of 48 channels. One group 138 is shown in FIG. 6 for illustrative purposes. The carriers 136 are spaced on a grid of center frequencies separated by 38 kHz. This spacing determines design parameters of the polyphase demultiplexers. For each satellite 25, preferably 288 uplink PRC SCPC/FDMA carriers can be received from a number of broadcast stations 23. Six polyphase demultiplexers and demodulators 122 are therefore preferably used. An on-board processor 116 accepts these PRC SCPC/FDMA uplink carriers 136 and converts them into three downlink TDM carriers, each carrying 96 of the PRCs in 96 time slots.

The 288 carriers are received by an uplink global beam antenna 118 and each group of 48 channels is frequency converted to an intermediate frequency (IF) which is then filtered to select a frequency band occupied by that particular group 138. This processing takes places in the receiver 120. The filtered signal is then supplied to an analog-to-digital (A/D) converter 140 before being supplied as an input to a polyphase demultiplexer 144. The demultiplexer 144 separates the 48 SCPC/FDMA channels 138 into a time division multiplexed analog signal stream comprising QPSK modulated symbols that sequentially present the content of each of 48 SCPC/FDMA channels at the output of the demultiplexer 144. This TDM analog signal stream is routed to a digitally implemented QPSK demodulator and differential decoder 146. The QPSK demodulator and differential decoder 146 sequentially demodulates the QPSK modulated symbols into digital baseband bits. Demodulation processing requires symbol timing and carrier recovery. Since the modulation is QPSK, baseband symbols containing two-bits each are recovered for each carrier symbol. The demultiplexer 144 and demodulator and decoder 146 will hereinafter be referred to as a demultiplexer/demodulator (D/D) 148. The D/D is preferably accomplished using high speed digital technology using the known Polyphase technique to demultiplex the uplink carriers 21. The QPSK demodulator is preferably a serially-shared, digitally-implemented demodulator for recovering the baseband two-bit symbols. The recovered symbols 114 from each PRC carrier 110 are subsequently differentially decoded to recover the original PRC symbols 108 applied at the input encoders, that is, the channel distributors 82 and 98 in FIG. 3, at the broadcast station 23. The satellite 25 payload preferably comprises six digitally implemented, 48 carrier D/Ds 148. In addition, two spare D/Ds 148 are provided in the satellite payload to replace any failed processing units.

Figure 6:
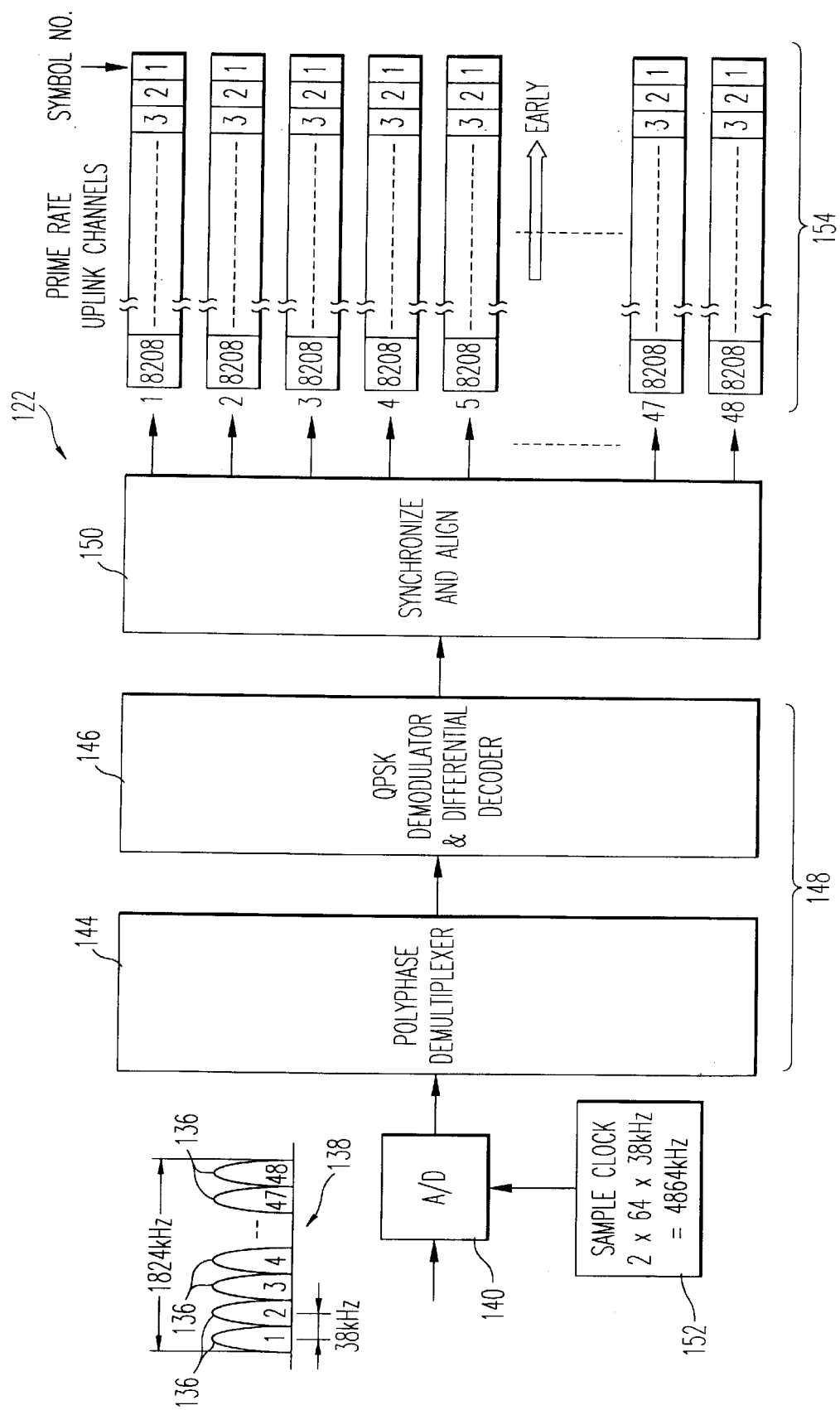
FIG. 6 is a schematic diagram illustrating on-board satellite demultiplexing and demodulation processing in accordance with an embodiment of the present invention.

With continued reference to FIG. 6, the processor 116 is programmed in accordance with a software module indicated at 150 to perform a synchronization and rate alignment function on the time division multiplexed symbol stream generated at the output of the QPSK demodulator and differential decoder 146. The software and hardware components (e.g., digital memory buffers and oscillators) of the rate alignment module 150 in FIG. 6 are described in more detail with reference to FIG. 7. The rate alignment module 150 compensates for clock rate differences between the on-board clock 152 and that of the symbols carried on the individual uplink PRC carriers 138 received at the satellite 25. The clock rates differ because of different clock rates at different broadcast stations 23, and different Doppler rates from different locations caused by motion of the satellite 25. Clock rate differences attributed to the broadcast stations 23 can originate in clocks at a broadcast station itself or in remote clocks, the rates of which are transferred over terrestrial links between a broadcast studio and a broadcast station 23.

The rate alignment module 150 adds or removes a "0" value symbol, or does neither operation in the PRC header portion 112 of each 432 ms recovered frame 100. A "0" value symbol is a symbol that consists of a bit value 0 on both the I and Q channels of the QPSK-modulated symbol. The PRC header 112 comprises 48 symbols under normal operating conditions and consists of an initial symbol of "0" value, followed by 47 other symbols. When the symbol times of the uplink clock, which is recovered by the QPSK demodulator 146 along with the uplink carrier frequency, and those of the on-board clock 152 are synchronized, no change is made to the PRC preamble 112 for that particular PRC 110.

When the arriving uplink symbols have a timing that lags behind the on-board clock 152 by one symbol, a "0" symbol is added to the start of the PRC preamble 112 for the PRC currently being processed, yielding a length of 49 symbols. When the arriving uplink symbols have a timing that leads the on-board clock 152 by one symbol, a "0" symbol is deleted at the start of the PRC preamble 112 of the current PRC being processed, yielding a length of 47 symbols.

As stated previously, the input signal to the rate alignment module 150 comprises the stream of the recovered baseband two-bit symbols for each received uplink PRC at their individual original symbol rates. There are 288 such streams issued from the D/D 148 corresponding to each of the six active processors 116. The action involving only one D/D 148 and one rate alignment module 150 is described, although it is to be understood that the other five active processors 116 on the satellite perform similar functions.

Figure 8:
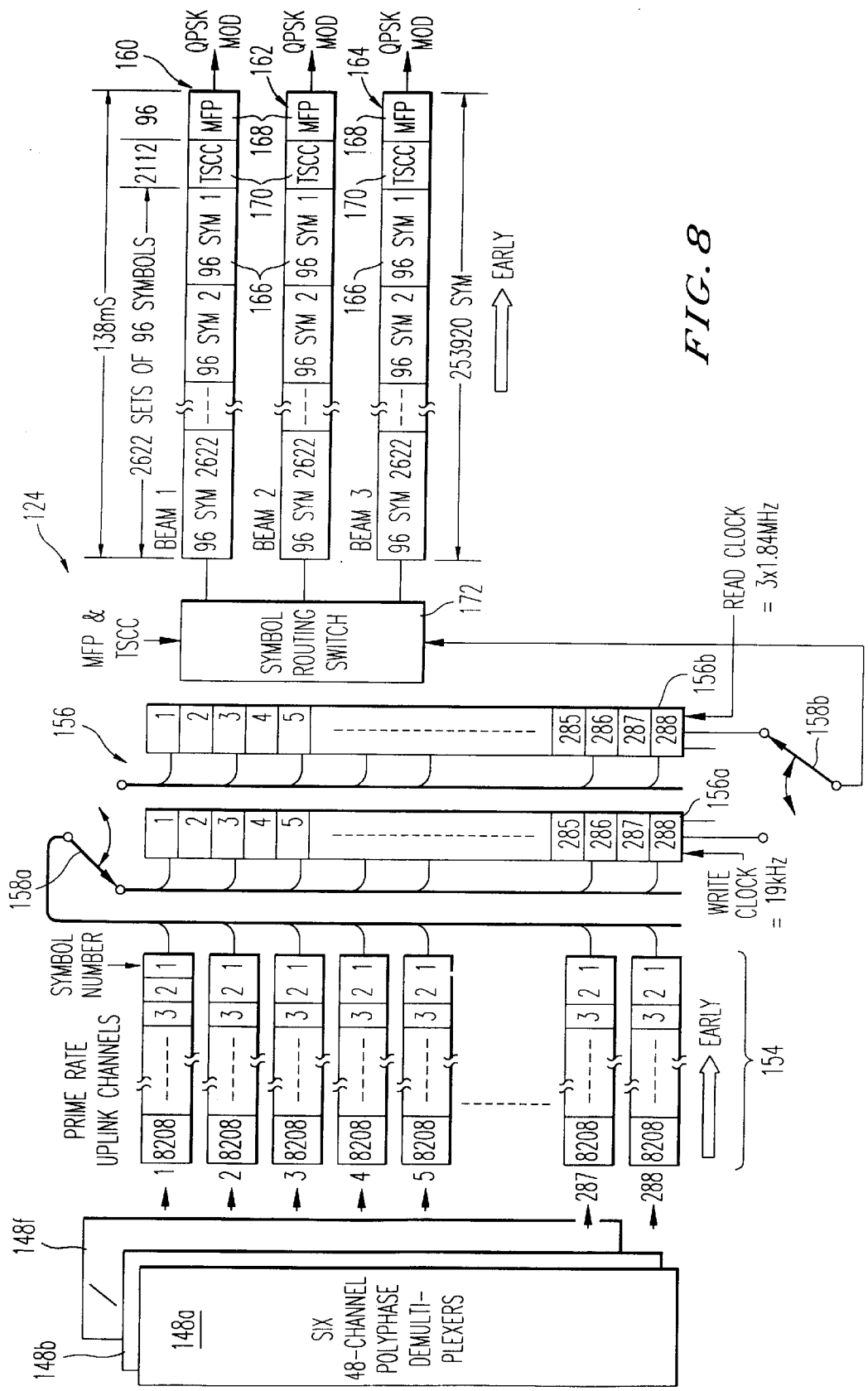
FIG. 8 is a schematic diagram illustrating on-board satellite switching and time division multiplexing operations in accordance with an embodiment of the present invention.

To rate align uplink PRC symbols to the on-board clock 152, three steps are performed. First, the symbols are grouped in terms of their original 8208 two-bit symbol PRC frames 110 in each buffer 149 and 151 of a ping-pong buffer 153. This requires correlation of the PRC header 112 (which contains a 47 symbol unique word) with a local stored copy of the unique word in correlators indicated at 155 to locate the symbols in a buffer. Second, the number of on-board clock 152 ticks between correlation spikes is determined and used to adjust the length of the PRC header 112 to compensate for the rate difference. Third, the PRC frame, with its modified header, is clocked at the on-board rate into its appropriate location in a switching and routing memory device 156 (FIG. 8).

PRC symbols enter the ping-pong buffer pair 153 at the left. The ping-pong action causes one buffer 149 or 151 to fill at the uplink clock rate, and the other buffer to simultaneously empty at the on-board clock rate. The roles reverse from one frame to the next and cause continuous flow between input and output of the buffer 149 and 151. Newly arriving symbols are written to the buffer 149 or 151 to which they happen to be connected. Writing continues to fill the buffer 149 or 151 until the correlation spike occurs. Writing then stops, and the input and output switches 161 and 163 switch to the reverse state. This captures an uplink PRC frame so that its 48 header symbols reside in the 48 symbol slots with one slot left unfilled at the output end of the buffer and the 8160 data symbols fill the first 8160 slots. The contents of the subject buffer are immediately read to the output thereof at the on-board clock rate. The number of symbols read out are such that the PRC header contains 47, 48 or 49 symbols. A "0" value symbol is removed or added at the start of the PRC header to make this adjustment. The header length 112 is controlled by a signal coming from a frame symbol counter 159 which counts the number of on-board clock rate symbols that will fall in a PRC frame period to determine the header length. The ping-pong action alternates the roles of the buffers.

To perform the count, the frame correlation spikes coming from the buffer correlators 155, as PRC frames fill the buffers 149 and 151, are smoothed by a synch pulse oscillator (SPC) 157. The smoothed sync pulses are used to count the number of symbol epochs per frame. The number will be 8207, 8208 or 8209 indicating whether the PRC header should be 47, 48 or 49 symbols long, respectively. This information causes the proper number of symbols to come from the frame buffers to maintain symbol flow synchronously with the on-board clock and independently of earth terminal origin.

For the rate differences anticipated over the system 10, the run times between preamble 112 modifications are relatively long. For instance, clock rate differences of $10^{-6}$ will elicit PRC preamble corrections on the average of one every 123 PRC frames. The resulting rate adjustments cause the symbol rates of the PRCs 110 to be precisely synchronized to the on-board clock 152. This allows routing of the baseband bit symbols to the proper locations in a TDM frame. The synchronized PRCs are indicated generally at 154 in FIG. 6. The on-board routing and switching of these PRCs 154 into TDM frames will now be described with reference to FIG. 8.

Figure 7:
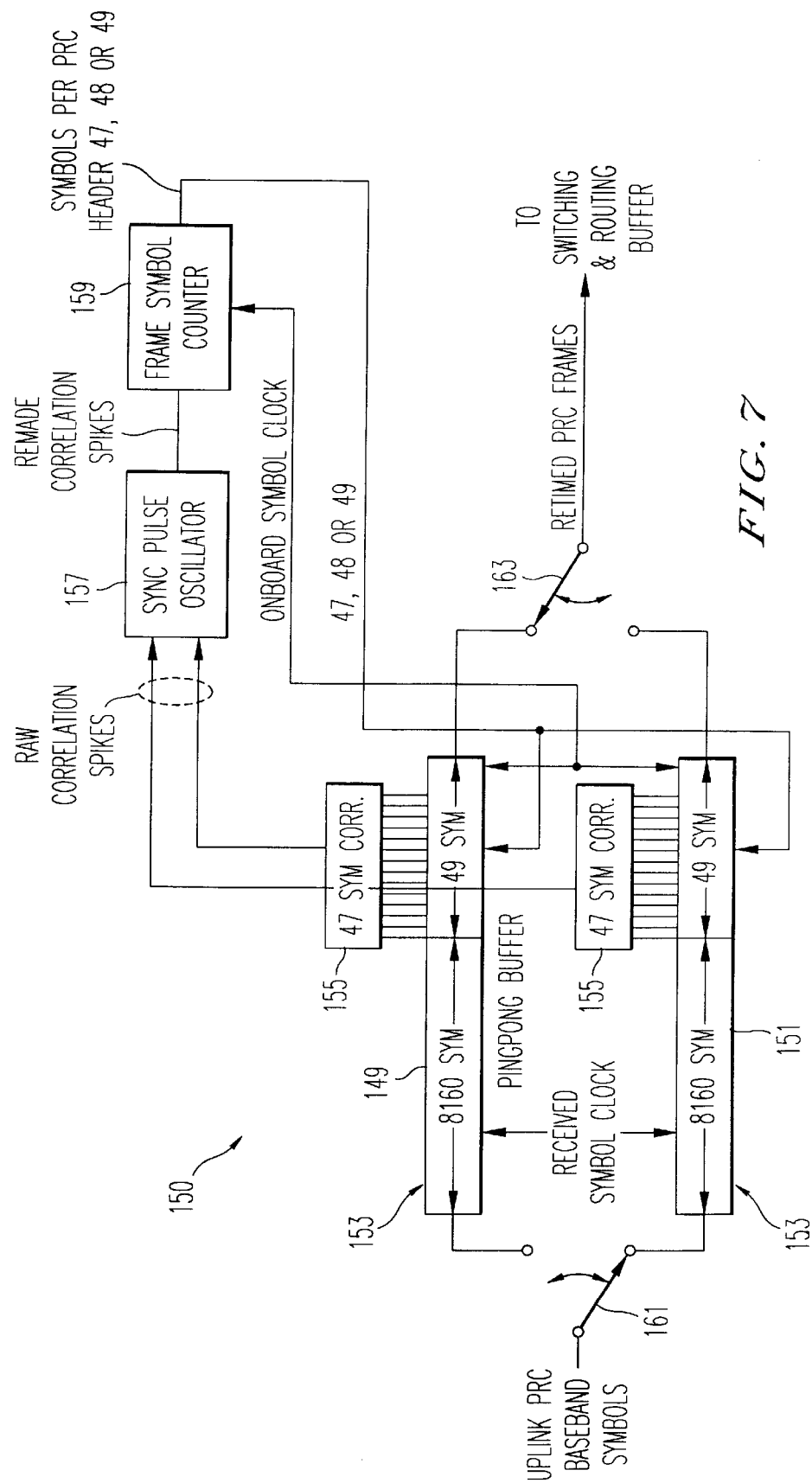
FIG. 7 is a schematic diagram illustrating on-board satellite rate alignment processing in accordance with an embodiment of the present invention.

FIG. 6 illustrates PRC processing by a single D/D 148. Similar processing is performed by the other five active D/Ds on-board the satellite. The PRCs emanating from each of the six D/Ds 148, having been synchronized and aligned, occur in a serial stream having a symbol rate of 48×19,000 which equals 912,000 symbols per second for each D/D 148. The serial stream from each D/D 148 can be demultiplexed into 48 parallel PRC streams having rates of 19,000 symbols per second, as shown in FIG. 7. The aggregate of the PRC streams coming from all six D/Ds 148 on-board the satellite 25 is 288, with each D/D 148 carrying 19,000 sym/s streams. The symbols therefore have epochs or periods of 1/19,000 seconds which equals approximately 52.63 microseconds duration.

As shown in FIG. 8, 288 symbols are present at the outputs of the six D/Ds 148a, 148b, 148c, 148d, 148e and 148f for every uplink PRC symbol epoch. Once each PRC symbol epoch, 288 symbol values are written into a switching and routing memory 156. The contents of the buffer 156 are read into three downlink TDM frame assemblers 160, 162 and 164. Using a routing and switching component designated as 172, the contents of each of the 288 memory locations are read in terms of 2622 sets of 96 symbols to each of the three TDM frames in assemblers 160, 162 and 164 in an epoch of 136.8 ms which occurs once every TDM frame period or 138 ms. The scan rate or 136.8/2622 is therefore faster than the duration of a symbol. The routing switch and modulator 124 comprises a ping-pong memory configuration indicated generally at 156 and comprising buffers 156a and 156b, respectively. The 288 uplink PRCs indicated at 154 are supplied as input to the routing switch and modulator 124. The symbols of each PRC occur at a rate of 19,000 symbols per second corrected to the on-board clock 152 timing. The PRC symbols are written in parallel at the 19,000 Hz clock rate into 288 positions in the ping-pong memory 156a or 156b serving as the input. At the same time, the memory serving as the output 156b or 156a, respectively, is reading the symbols stored in the previous frame into the three TDM frames at a read rate of 3×1.84 MHz. This latter rate is sufficient to allow the simultaneous generation of the three TDM parallel streams, one directed to each of three beams. Routing of the symbols to their assigned beam is controlled by a symbol routing switch 172. This switch can route a symbol to any one, two or three of the TDM streams. Each TDM stream occurs at a rate of 1.84 Msym/s. The output memory is clocked for an interval of 136.8 ms and pauses for 1.2 ms to allow insertion of the 96 symbol MFP and 2112 symbol TSCC. Note that for every symbol that is read into more than one TDM stream, there is an off-setting uplink FDM PRC channel that is not used and is skipped. The ping-pong memory buffers 156a and 156b exchange roles from frame to frame via the switch components 158a and 158b.

With continued reference to FIG. 8, sets of 96 symbols are transferred to 2622 corresponding slots in each TDM frame. The corresponding symbols (i.e., the ith symbols) for all 96 uplink PRCs are grouped together in the same TDM frame slot as illustrated by the slot 166 for symbol 1. The contents of the 2622 slots of each TDM frame are scrambled by adding a pseudorandom bit pattern to the entire 136.8 ms epoch. In addition, a 1.2 ms epoch is appended at the start of each TDM frame to insert a master frame preamble (MFP) of 96 symbols and a TSCC of 2112 symbols, as indicated at 168 and 170, respectively. The sum of the 2622 time slots, each carrying 96 symbols, and the symbols for the MFP and TSCC is 253,920 symbols per TDM frame, resulting in a downlink symbol rate of 1.84 Msym/s.

The routing of the PRC symbols between the outputs of the six D/Ds 148A, 148B, 148C, 148D, 148E and 148F and the inputs to the TDM frame assemblers 160, 162 and 164 is controlled by an on-board switching sequence unit 172 which stores instructions sent to it over a command link from the SCC 238 (FIG. 12) from the ground. Each symbol originating from a selected uplink PRC symbol stream can be routed to a time slot in a TDM frame to be transmitted to a desired destination beam 27. The method of routing is independent of the relationships between the time of occurrence of symbols in various uplink PRCs and the occurrence of symbols in the downlink TDM streams. This reduces the complexity of the satellite 25 payload. Further, a symbol originating from a selected uplink PRC can be routed to two or three destination beams via the switch 158.

Radio Receiver Operation

A radio receiver 29 for use in the system 10 will now be described with reference to FIG. 9. The radio receiver 29 comprises an radio frequency (RF) section 176 having an antenna 178 for L-band electromagnetic wave reception, and prefiltering to select the operating band of the receiver (e.g., 1452 to 1492 MHz). The RF section 176 further comprises a low noise amplifier 180 which is capable of amplifying the receive signal with minimum self-introduced noise and of withstanding interference signals that may come from another service sharing the operating band of the receiver 29. A mixer 182 is provided to down-convert the received spectrum to an intermediate frequency (IF). A high performance IF filter 184 selects the desired TDM carrier bandwidth from the output of the mixer 182 and a local oscillator synthesizer 186, which generates the mixing input frequencies needed to down-convert the desired signal to the center of the IF filter. The TDM carriers are located on center frequencies spaced on a grid having 460 kHz separations. The bandwidth of the IF filter 184 is approximately 2.5 MHz. The separation between carriers is preferably at least seven or eight spaces or approximately 3.3 MHz. The RF section 176 is designed to select the desired TDM carrier bandwidth with a minimum of internally-generated interference and distortion and to reject unwanted carriers that can occur in the operating band from 152 to 192 MHz. In most areas of the world, the levels of unwanted signals are nominal, and typically the ratios of unwanted signals to desired signals of 30 to 40 dB provides sufficient protection. In some areas, operations near high power transmitters (e.g., in the vicinity of terrestrial microwave transmitters for public switched telephone networks or other broadcast audio services) requires a front end design capable of better protection ratios. The desired TDM carrier bandwidth retrieved from the downlink signal using the RF section 176 is provided to an A/D converter 188 and then to a QPSK demodulator 190. The QPSK demodulator 190 is designed to recover the TDM bit stream transmitted from satellite 25, that is, via the on-board processor payload 121 or the on-board transparent payload 133, on a selected carrier frequency.

The QPSK demodulator 190 is preferably implemented by first converting the IF signal from the RF section 176 into a digital representation using the A/D converter 188, and then implementing the QPSK using a known digital processing method. Demodulation preferably uses symbol timing and carrier frequency recover and decision circuits which sample and decode the symbols of the QPSK modulated signal into the baseband TDM bit stream.

The A/D converter 188 and QPSK demodulator 190 are preferably provided on a channel recovery chip 187 for recovering the broadcast channel digital baseband signal from the IF signals recovered by the RF/IF circuit board 176. The channel recovery circuit 187 comprises a TDM synchronizer and predictor module 192, a TDM demultiplexer 194, a PRC synchronizer alignment and multiplexer 196, the operations of which will be described in further detail in connection with FIG. 10. The TDM bit stream at the output of the QPSK demodulator 190 is provided to a MFP synchronization correlator 200 in the TDM synchronizer and predictor module 192. The correlator 200 compares the bits of the received stream to a stored pattern. When no signal has previously been present at the receiver, the correlator 200 first enters a search mode in which it searches for the desired MFP correlation pattern without any time gating or aperture limitation applied to its output. When the correlator discovers a correlation event, it enters a mode wherein a gate opens at a time interval in which a next correlation event is anticipated. If a correlation event occurs again within the predicted time gate epoch, the time gating process is repeated. If correlation occurs for five consecutive time frames, for example, synchronization is declared to have been determined in accordance with the software. The synchronization threshold, however, can be changed. If correlation has not occurred for the minimum number of consecutive time frames to reach the synchronization threshold, the correlator continues to search for the correlation pattern.

Assuming that synchronization has occurred, the correlator enters a synchronization mode in which it adjusts its parameters to maximize probability of continued synchronization lock. If correlation is lost, the correlator enters a special predictor mode in which it continues to retain synchronization by prediction of the arrival of the next correlation event. For short signal dropouts (e.g., for as many as ten seconds), the correlator can maintain sufficiently accurate synchronization to achieve virtually instantaneous recovery when the signal returns. Such rapid recovery is advantageous because it is important for mobile reception conditions. If, after a specified period, correlation is not reestablished, the correlator 200 returns to the search mode. Upon synchronization to the MFP of the TDM frame, the TSCC can be recovered by the TDM demultiplexer 194 (block 202 in FIG. 10). The TSCC contains information identifying the program providers carried in the TDM frame and in which locations of the 96 PRCs each program provider's channel can be found. Before any PRCs can be demultiplexed from the TDM frame, the portion of the TDM frame carrying the PRC symbols is preferably descrambled. This is done by adding the same scrambling pattern at the receiver 29 that was added to the PRC portion of the TDM frame bit stream on-board the satellite 25. This scrambling pattern is synchronized by the TDM frame MFP.

The symbols of the PRCs are not grouped contiguously in the TDM frame, but are spread over the frame. There are 2622 sets of symbols contained in the PRC portion of the TDM frame. In each set, there is one symbol for each PRC in a position which is numbered in ascending order from 1 to 96. Thus, all symbols belonging to PRC 1 are in the first position of all 2622 sets. Symbols belonging to PRC 2 are in the second position of all 2622 sets, and so on, as shown in block 204. This arrangement for numbering and locating the symbols of the PRCs in the TDM frame, in accordance with the present invention, minimizes the size of the memory for performing the switching and routing on-board the satellite and for demultiplexing in the receiver. As shown in FIG. 9, the TSCC is recovered from the TDM demultiplexer 194 and provided to the controller 220 at the receiver 29 to recover the n PRCs for a particular broadcast channel. The symbols of the n PRCs associated with that broadcast channel are extracted from the unscrambled TDM frame time slot locations identified in the TSCC. This association is performed by a controller contained in the radio and is indicated generally at 205 in FIG. 10. The controller 220 accepts a broadcast selection identified by the radio operator, combines this selection with the PRC information contained in the TSCC, and extracts and reorders the symbols of the PRCs from the TDM frame to restore the n PRCs.

Figure 9:
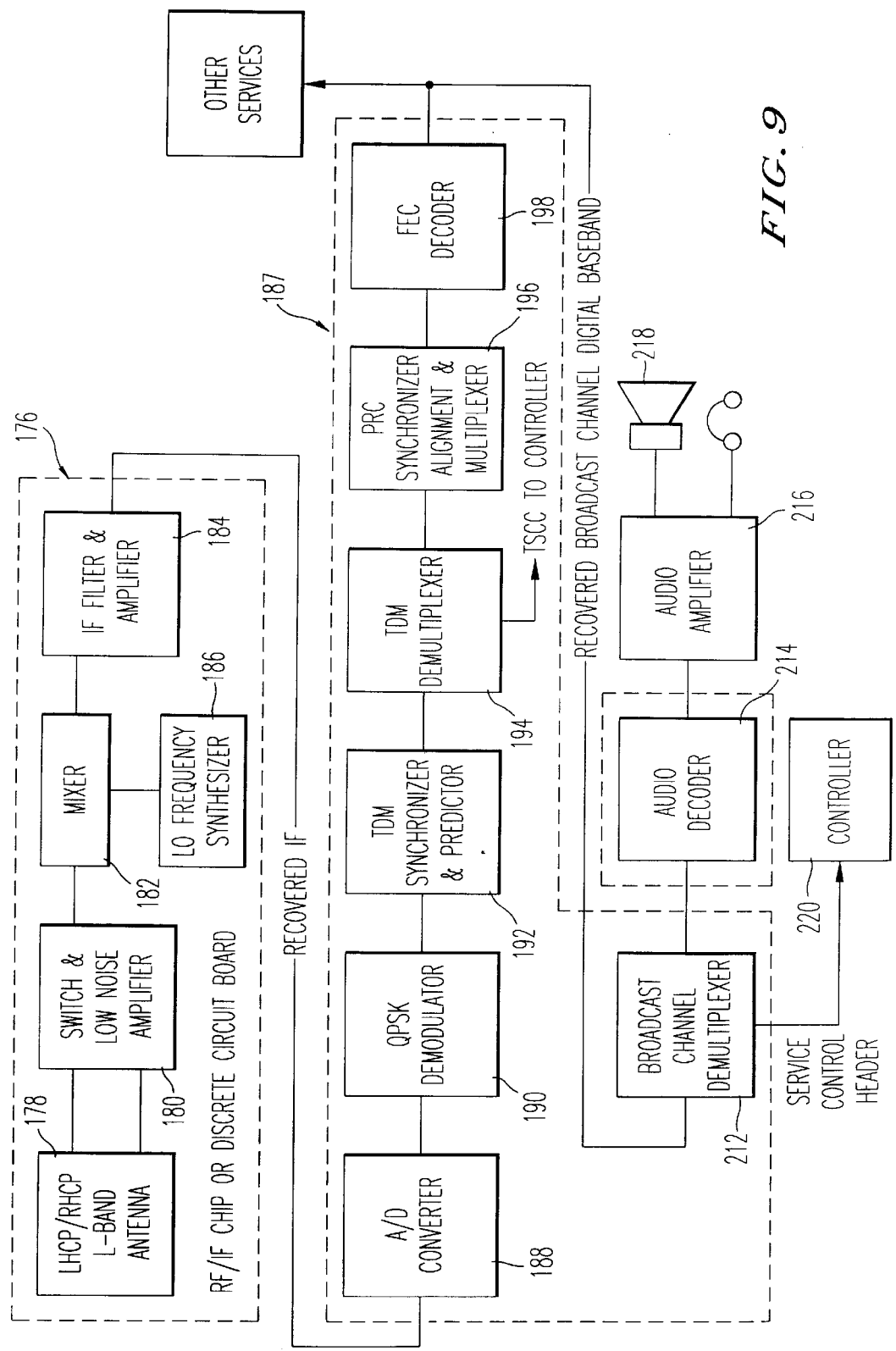
FIG. 9 is a schematic block diagram of a radio receiver for use in the system depicted in FIG. 1 and constructed in accordance with an embodiment of the present invention.
Figure 10:
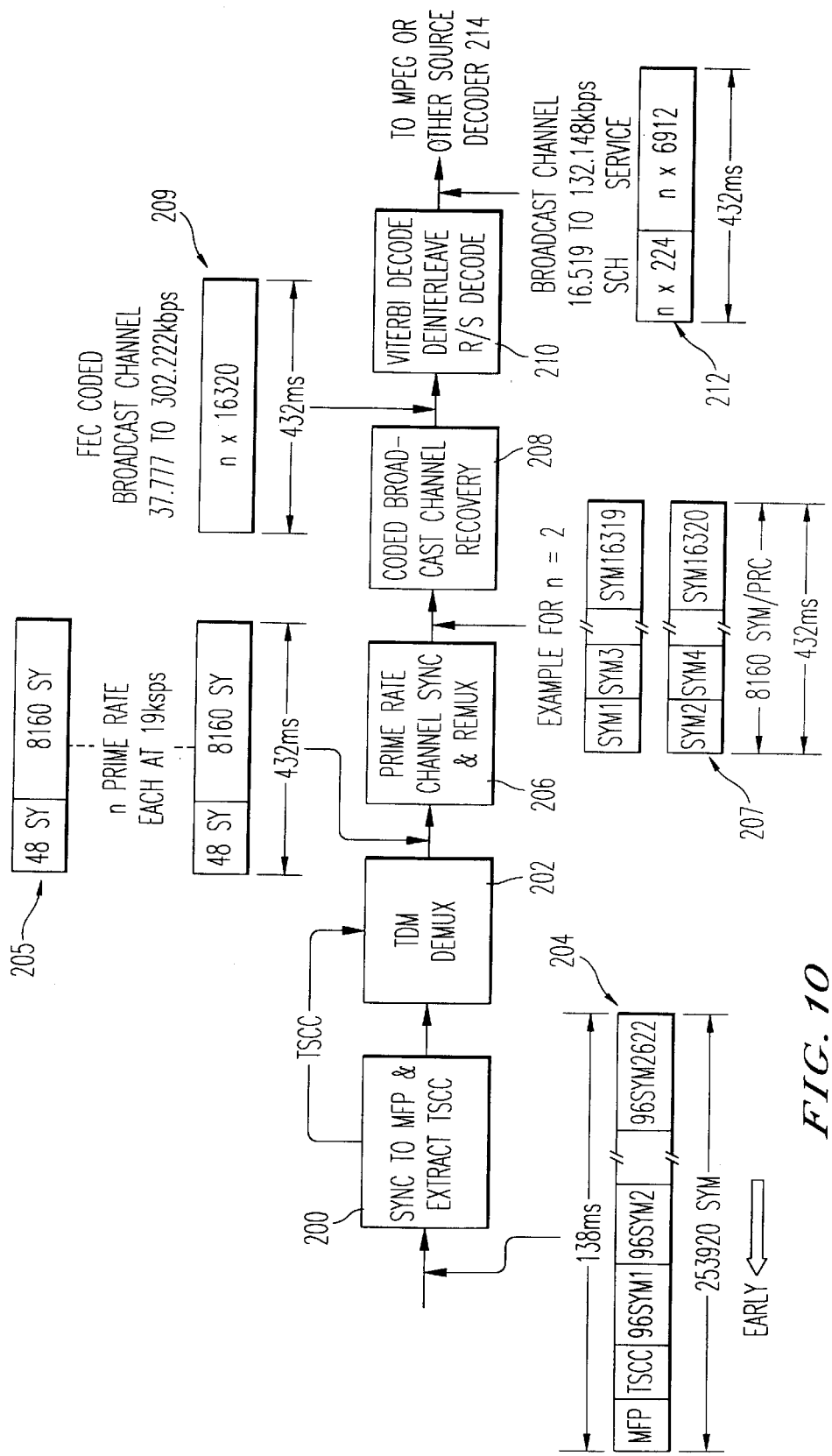
FIG. 10 is a schematic diagram illustrating receiver synchronization and demultiplexing operations in accordance with an embodiment of the present invention.

With reference to blocks 196 and 206, respectively, in FIGS. 9 and 10, the symbols of each of the n PRCs (e.g., as indicated at 207) associated with a broadcast channel (e.g., as indicated at 209) selected by the radio operator are remultiplexed into an FEC-coded broadcast channel (BC) format. Before the remultiplexing is accomplished, the n PRCs of a broadcast channel are realigned. Realignment is useful because reclocking of symbol timing encountered in multiplexing, demultiplexing and on-board rate alignment in passage over the end-to-end link in system 10 can introduce a shift of as many as four symbols in the relative alignment of the recovered PRC frames. Each of the n PRCs of a broadcast channel has a 48 symbol preamble, followed by 8160 coded PRC symbols. To recombine these n PRCs into the broadcast channel, synchronization is performed to the 47, 48 or 49 symbol header of each of the PRCs. The length of the header depends on the timing alignment performed on the uplink PRCs on the satellite 25. Synchronization is accomplished using a preamble correlator operating on the 47 most recently received symbols of the PRC header for each of the n PRCs. The preamble correlator detects incidents of correlation and emits a single symbol duration correlation spike. Based on the relative time of occurrence of the correlation spikes for the n PRCs associated with the broadcast channel, and operating in conjunction with alignment buffers having a width of four symbols, the symbol content of the n PRCs can be precisely aligned and remultiplexed to recover the FEC-coded broadcast channel. Remultiplexing of the n PRCs to reform the FEC-coded broadcast channel preferably requires that the symbol spreading procedure used at the broadcast station 23 for demultiplexing the FEC-coded broadcast channel into the PRCs be performed in the reverse order, as indicated in blocks 206 and 208 of FIG. 10.

Figure 11:
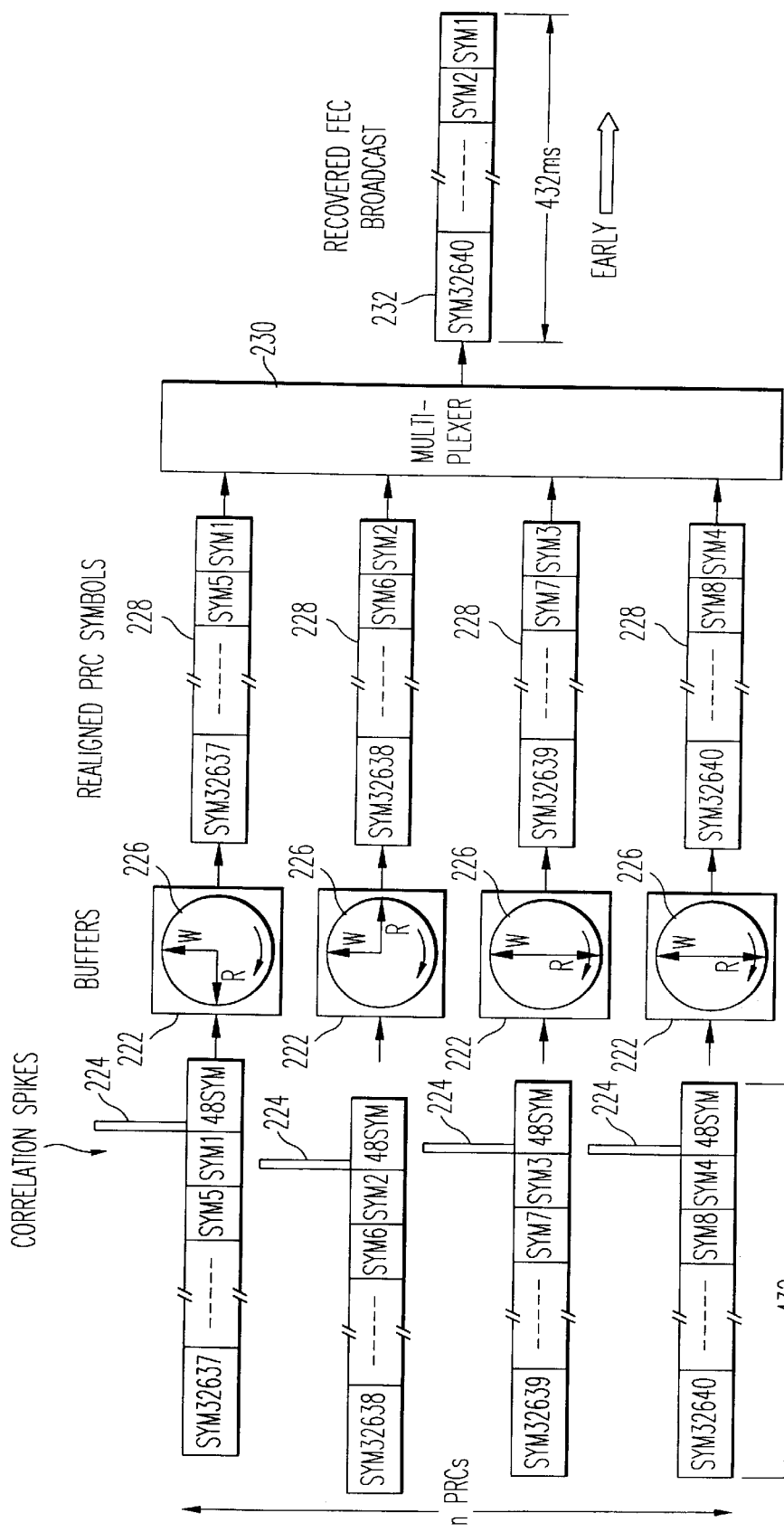
FIG. 11 is a schematic diagram illustrating synchronization and multiplexing operations for recovering coded broadcast channels at a receiver in accordance with an embodiment of the present invention.

FIG. 11 illustrates how a broadcast channel, comprising four PRCs, for example, is recovered at the receiver (block 196 in FIG. 9). At the left, four demodulated PRCs are shown arriving. Due to reclocking variations, and different time delays encountered from the broadcast station through the satellite to the radio, up to four symbols of relative offset can occur among the n PRCs constituting a broadcast channel. The first step in recovery is to realign the symbol content of these PRCs. This is done by a set of FIFO buffers each having a length equal to the range of variation. Each PRC has its own buffer 222. Each PRC is first supplied to a PRC header correlator 226 that determines the instant of arrival. The arrival instants are shown by a correlation spike 224 for each of the four PRCs in the illustration. Writing (W) starts into each buffer 222 immediately following the instant of correlation and continues thereafter until the end of the frame. To align the symbols to the PRCs, reading (R) from all of the buffers 222 starts at the instant of the last correlation event. This causes the symbols of all PRCs to be synchronously read out in parallel at the buffer 222 outputs (block 206). The realigned symbols 228 are next multiplexed via a multiplexer 230 into a single serial stream that is the recovered coded broadcast channel 232 (block 208). Due to on-board clock 152 rate alignment, the length of the PRC header may be 47, 48 or 49 symbols long. This variation is eliminated in the correlator 226 by using only the last 47 symbols to arrive to detect the correlation event. These 47 symbols are specially selected to yield optimum correlation detection.

With reference to block 198 and 210 of FIGS. 9 and 10 respectively, the FEC-coded broadcast channel is subsequently provided to the FEC processing module 210. Most of the errors encountered in transmission between the location of the coders and the decoders is corrected by FEC processing. FEC processing preferably employs a Viterbi Trellis Decoder, followed by deinterleaving and then a Reed Solomon decoder. FEC processing recovers the original broadcast channel comprising n×16 kbps channel increments and its n×224 bit SCH (block 212).

The n×16 kbps segment of the broadcast channel is provided to a decoder such as MPEG 2.5 Layer 3 source decoder 214 for conversion back to audio signals. Thus, receiver processing is available using a low cost radio for broadcast channel reception from satellites. Since the transmissions of the broadcast programs via satellites 25 is digital, a number of other services are supported by the system 10 which are also expressed in digital format. As stated previously, the SCH contained in the broadcast channels provides a control channel for a wide variety of future service options. Thus, chip sets can be produced to implement these service options by making the entire TDM bit stream and its raw demodulated format, the demultiplexed TSCC information bits, and the recovered error corrected broadcast channel available. Radio receivers 29 can also be provided with an identification code for uniquely addressing each radio. The code can be accessed by means of bits carried in a channel of the SCH of the broadcast channel. For mobile operation using the radio receiver 29 in accordance with the present invention, the radio is configured to predict and recover substantially instantaneously the locations of MFP correlation spikes to an accuracy of ¼th symbol for intervals of as many as ten seconds. A symbol timing local oscillator having a short time accuracy of better than one part per 100,000,000 is preferably installed in the radio receiver, particularly for a hand-held radio 29b.

System for Managing Satellite and Broadcast Stations

Figure 12:
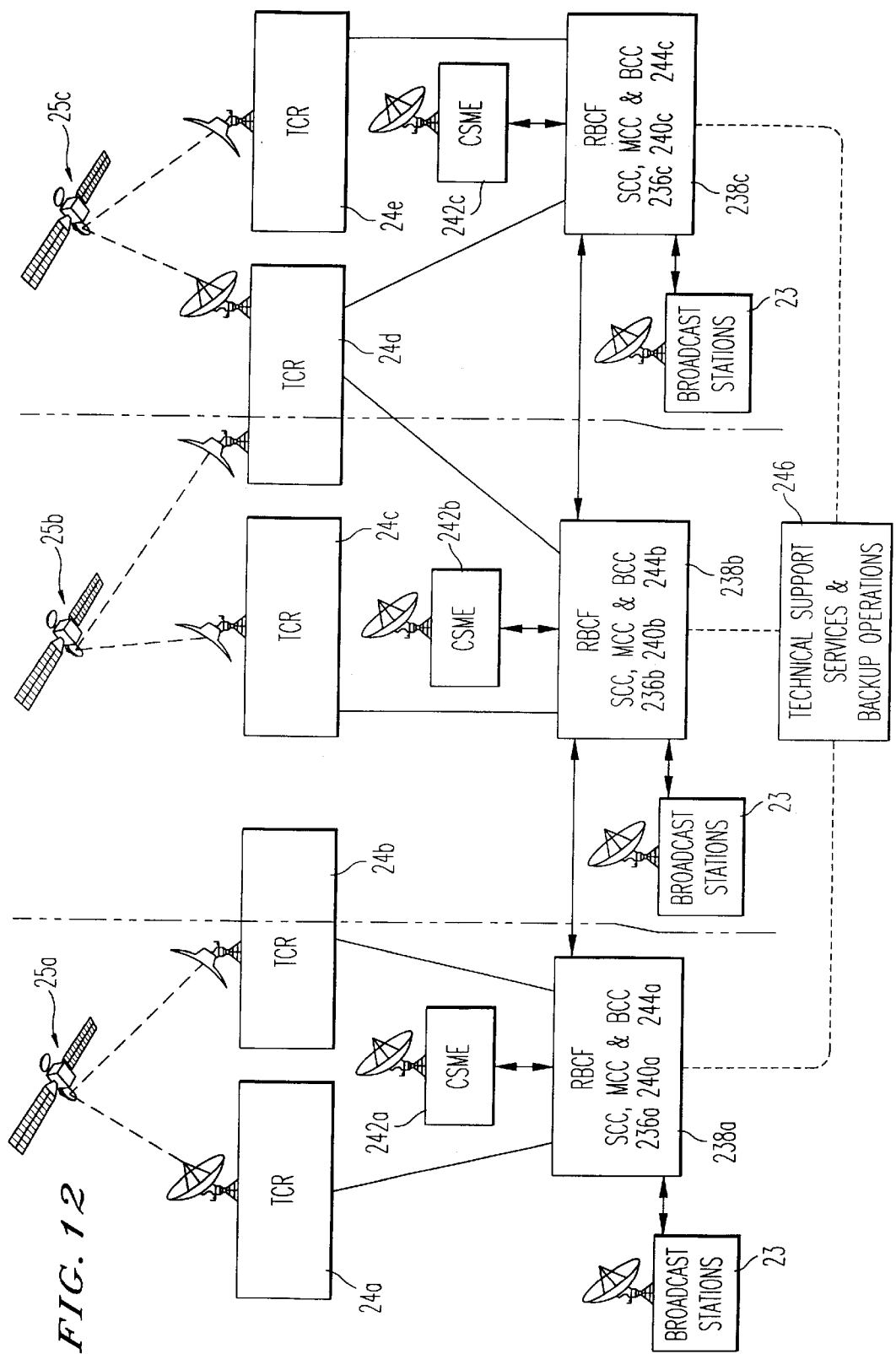
FIG. 12 is a schematic diagram of a system for managing satellite and broadcast stations in accordance with an embodiment of the present invention.

As stated previously, the system 10 can comprise one or a plurality of satellites 25. FIG. 12 depicts three satellites 25a, 25b and 25c for illustrative purposes. A system 10 having several satellites preferably comprises a plurality of TCR stations 24a, 24b, 24c, 24d and 24e located such that each satellite 25a, 25b and 25c is in line of sight of two TCR stations. The TCR stations referred to generally with reference numeral 24 are controlled by a regional broadcast control facility (RBCF) 238a, 238b or 238c. Each RBCF 238a, 238b and 238c comprises a satellite control center (SCC) 236a, 236b and 236c, a mission control center (MCC) 240a, 240b and 240c, and a broadcast control center (BCC) 244a, 244b and 244c, respectively. Each SCC controls the satellite bus and the communications payload and is where a space segment command and control computer and manpower resources are located. The facility is preferably manned 24 hours a day by a number of technicians trained in in-orbit satellite command and control. The SCCs 236a, 236b and 236c monitor the on-board components and essentially operate the corresponding satellite 25a, 25b and 25c. Each TCR station 24 is preferably connected directly to a corresponding SCC 236a, 236b or 236c by full-time, dual redundant PSTN circuits.

In each of the regions serviced by the satellites 25a, 25b and 25c, the corresponding RBCF 238a, 238b and 238c reserves broadcast channels for audio, data, video image services, assigns space segment channel routing via the mission control center (MCC) 240a, 240b, 240c, validates the delivery of the service, which is information required to bill a broadcast service provider, and bills the service provider.

Each MCC is configured to program the assignment of the space segment channels comprising uplink PRC frequency and downlink PRC TDM slot assignments. Each MCC performs both dynamic and static control. Dynamic control involves controlling time windows for assignments, that is, assigning space segment usage on a monthly, weekly and daily basis. Static control involves space segment assignments that do not vary on a monthly, weekly and daily basis. A sales office, which has personnel for selling space segment capacity at the corresponding RBCF, provides the MCC with data indicating available capacity and instructions to seize capacity that has been sold. The MCC generates an overall plan for occupying the time and frequency space of the system 10. The plan is then converted into instructions for the on-board routing switch 172 and is sent to the SCC for transmission to the satellite. The plan can be updated and transmitted to the satellite preferably once every 12 hours. The MCC 240a, 240b and 240c also monitors the satellite TDM signals received by corresponding channel system monitor equipment (CSME) 242a, 242b and 242c. CSME stations verify that broadcast stations 23 are delivering broadcast channels within specifications.

Each BCC 244a, 244b and 244c monitors the broadcast earth stations 23 in its region for proper operation within selected frequency, power and antenna pointing tolerances.

The BCCs can also connect with corresponding broadcast stations to command malfunctioning stations off-the-air. A central facility 246 is preferably provided for technical support services and back-up operations for each of the SCCs.

Signaling Protocol

In accordance with a preferred embodiment of the present invention, information to be broadcast to the radio receivers 29 is formatted into a waveform in accordance with a signaling protocol which presents many advantages over existing broadcast systems. The processing of information for broadcast transmission and reception is summarized in FIG. 13 which illustrates a broadcast segment 250, a space segment 252 and a radio segment 254 of a satellite direct radio broadcast system 10 constructed in accordance with a preferred embodiment of the present invention. Both the service layer and the transport layer of the system 10 is described below.

With regard to the broadcast segment 250, a number of steps in the formatting procedure are similar to those described previously herein. For example, the demultiplexing (block 256) of encoded and interleaved broadcast channel bit streams and the addition of prime rate channel preambles (block 258) to generate the prime rate channels, which are transmitted via frequency division multiplex uplinks to a satellite 25, is similar to the process described above in connection with FIGS. 3 and 4. The process of generating a bit stream from different service components (e.g., service components 260 and 262) by adding a service control header (SCH) 264, scrambling the bit stream 266, and encoding the bit stream for forward error correction (FEC) (block 268), however, will now be described in connection with FIGS. 13, 14 and 15 which illustrate a preferred embodiment of the present invention. Encryption (block 265) will also be discussed in connection with the SCH and Table 1.

In accordance with the present invention, a broadcast service can include, but is not limited to, audio, data, multimedia, static images, dynamic images, paging signals, text, messages and panographic symbols. A service can be composed of several service components, illustrated by service components 260 and 262 in FIG. 13, which are delivered by a service provider. For example, a first service component can be audio, while a second service component can be text for display on a screen at the radio receivers or image data relating to the audio broadcast. In addition, a service can consist of a single service component or more than two service components. The service 261 is combined with a SCH 264 to create a service layer for the broadcast segment. The allocation of service components (e.g., service components 260 and 262) within the service 261 is dynamically controlled by the SCH in accordance with the present invention. As described above in connection with FIG. 4, a broadcast channel bit stream preferably has a frame period of 432 milliseconds. The SCH 102 in FIG. 4 has n×224 bits, and the service 104 comprises n×6912 bits, for a total of n×7136 bits per frame 100. The numeral n is the overall bit rate of the service divided by 16,000 bits per second (bps).

As stated previously, service components of a service 261 can carry audio service or digital service. The service component bit rate is preferably divisible in multiples of 8000 bps and is between 8000 bps and 128,000 bps. When the sum of the bit rates of all of the service components in the service 261 is lower than the bit rate of the service 261, the remaining bit rate is filled with a padding service component. Thus, the padding service component bit rate is $$n \times 16,000 - \prod_{i=1}^{N_{sc}} n(i) \times 8000 \text{ in bps}$$

where i is the $i^{th}$ service component of a service including $N_{SC}$ service components with $1 \geq = i \geq = N_{SC}$, n(i) is the bit rate of the $i^{th}$ service component divided by 8000 bps and n is the service bit rate divided by 16,000 bps.

Figure 14:
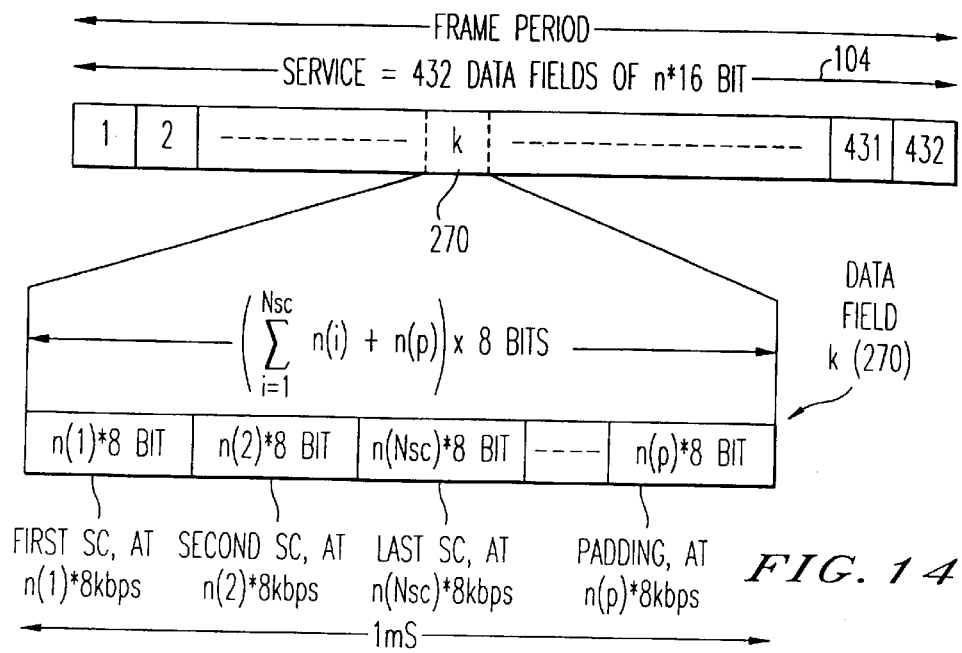
FIG. 14 is a diagram illustrating interleaving of service components within a frame period in the service layer of a system constructed in accordance with an embodiment of the present invention.

With reference to FIG. 14, the service components and the padding service component, if any, are preferably multiplexed within the 432 millisecond period of the frame 100. The portion 104 of the 432 millisecond frame period comprising the service 261, as opposed to the SCH 102, is preferably divided into 432 data fields. Each field 270 is provided with preferably 8 bits from each of the service components n(1), n(2) . . . n($N_{SC}$) and any padding service component n(p), thereby multiplexing $N_{SC}$ service components and the padding service component, if any, which compose the service 261. Thus, the bits of each service component are spread across the entire frame. Interleaving of service components within each broadcast frame is advantageous when burst errors occur. Only a small amount of an interleaved component is lost as the result of a burst error, as compared with the loss of a larger portion of a service component that has been merely time division multiplexed within a broadcast channel frame and not interleaved.

Audio service components are preferably digital audio signals compressed in accordance with the Motion Pictures Expert Group (MPEG) algorithms, such as MPEG 1, MPEG 2, MPEG 2.5, MPEG 2.5 layer 3, as well as extensions for low sampling frequencies. MPEG 2.5, layer 3 encoding is particularly useful for providing good quality audio at 16 and 32 Kbps. Layer 3 coding adds more spectrum resolution and entropy coding. The digital audio signals preferably have a bit rate multiple of 8000 bps and can be between 8000 and 128,000 bps. Possible sampling frequencies for audio service components of the present invention are 48 kHz or 32 kHz as defined by MPEG 1, 24 kHz or 16 kHz as defined by MPEG 2, or 12 kHz and 8 kHz as defined by MPEG 2.5. The sampling frequencies are preferably synchronized to the service component bit rate. The framing of the MPEG encoder is synchronized to the SCH. Thus, the first bit of the audio service component within the broadcast channel frame 100 is the first bit of the MPEG frame header.

Digital service components include other types of services which are not audio services, such as image, audio services which do not comply with the characteristics described above in connection with audio service components subjected to MPEG encoding, paging, file transfer data, among other digital data. Digital service components have bit rates of multiple of 8000 bps and can be between 8000 and 128,000 bps. Digital service components are formatted such that it is possible to access the service 261 using data fields defined in the SCH. The SCH data fields are described below in connection with Table 1.

The SCH comprises four types of field groups, that is, a Service Preamble, Service Control Data, Service Component Control Data and Auxiliary Services. In accordance with the present invention, the content of the SCH comprises data as shown in Table 1.

TABLE 1

SERVICE CONTROL HEADER

| Field Group | Field Name | Length (bit) | Contents |
|---|---|---|---|
| Service Preamble | Service Preamble | 20 | 0474B(hex) |
| Service Control Data | Bit Rate Index (BRI) (BRI = n) | 4 | Service bit rate divided by kbps<br>0000: no valid data<br>0001: 16 kbps<br>. . .<br>1000: 128 kbps<br>1001–1111: Reserved for Future Use (RFU) |
| Service Control Data | Encryption Control | 4 | 0000: no encryption<br>0001: static key<br>0010: ES1, common key, subscription period A (UC set A shall be used)<br>0011: ES1, common key, subscription period B (UC set B shall be used)<br>0100: ES1, broadcast channel specific key for subscription period A (UC set A shall be used)<br>0101: ES1, broadcast channel specific key for subscription period B (UC set B shall be used)<br>else: RFU |
| Service Control Data | Auxiliary Field Content Indicator 1 (ACI1) | 5 | 00(hex): not used or not known<br>01(hex): 16 bit encryption key selector<br>02(hex): RDS PI code<br>03(hex): Associated Broadcast Channel reference (PS Flag and ASP)<br>04(hex) to 1F(hex): RFU |
| Service Control Data | Auxiliary Field Content Indicator 2 (ACI2) | 7 | 00(hex): not used or not known<br>01(hex): 64 bit encryption key selector<br>02(hex): service label; ISO-Latin 1 based sequence<br>03(hex) to 7F(hex): RFU |
| Service Control Data | Number of Service Components ($N_{sc}$) | 3 | 000: One Service Component<br>001: Two Service Components<br>. . .<br>111: Eight Service Components |
| Service Control Data | Auxiliary Data Field 1 (ADF1) | 16 | Data field, with content defined by ACI1 |
| Service Control Data | ADF2 multiframe Start Flag (SF) | 1 | 1: first segment of the multiframe, or no multiframe 0: intermediate segment of the multiframe |
| Service Control Data | ADF2 Segment Offset and Length Field (SOLF) | 4 | If SF = 1 (first segment); SOLF contains the total number of segments of the multiframe minus 1.<br>0000: one segment multiframe (or no multiframe)<br>0001: two segments multiframe<br>. . .<br>1111: 16 segments multiframe<br>If SF = 0 (intermediate segment); SOLF contains the segment offset. SOLF values are 1,2 . . . , total number of segments of the multiframe −1. |
| Service Control Data | Auxiliary Data Field 2 (ADF2) | 64 | Data field, contents defined by ACI2 |
| Service Component Control Data | Service Component Control Field (SCCF) | $N_{sc} * 32$ | Each service component has a SCCF; see Table 3 for SCCF content |
| Auxiliary Service | Dynamic labels | variable: n * 224–128 −$N_{sc} * 32$ | Byte stream |

The Service Preamble is preferably 20 bits long and is selected to have good synchronization qualities during, for example, implementation of auto-correlation techniques. As shown in Table 1, the Service Preamble is preferably 0474B hexadecimal. The SCH also comprises a bit rate index (BR), which is preferably 4 bits in length and indicates the service bit rate divided by kilobits per second. For example, "000" can be used to indicate that no valid data (e.g., padding data that is to be ignored) is being transmitted in the current frame. A "0001" can be used to indicate a BRI of 16 kbps, whereas "100(B)" can indicate a BRI of 128 kbps. Accordingly, the BRI indicates the number of 16,000 bit per second components which compose a broadcast channel frame 100. The SCH preferably also comprises a field for encryption control. For example, one 4-bit value can be used to indicate that no encryption was used on the digital information in the service 104 part of the current frame 100 corresponding to the SCH 102. Other 4-bit binary values can be used to indicate when a particular type of key has been used to encrypt broadcast channel data. Common keys can be employed for encryption, as well as specific keys for encrypting a particular broadcast channel.

In accordance with an aspect of the present invention, the SCH 264 can be provided with an auxiliary data field (ADF1) and an auxiliary field contents indicator (ACI1) to allow a service provider to control specific functionalities associated with its service 261. The ADF1 and ACI1 can change from broadcast frame 100 to broadcast frame 100 at the service provider's discretion. The ACI1 contents are preferably an encryption key selector, a standardized radio data system or RDS code (e.g., a RDS PI code) and data for referencing associated broadcast channels.

For encryption applications, two different keys can be employed, that is, a key having a length of 16 bits for minor security and another key having a length of 64 bits for higher security. Depending on which key is indicated in the ACI1, the actual 16-bit key is transported in the ADF1 field, while the actual 64-bit key is transported in another auxiliary data field described below and referred to as "ADF2". Use of the 16-bit key or the 64-bit key is selected by the service provider. It is possible to change the key's bit length from broadcast channel frame 100 to broadcast channel frame 100, as desired by the service provider. The key selector in the ACI1 field can be, for example, an over-the-air code of a decryption key consisting of three parts: a user code for individualizing the user of the service, a hardware code for uniquely identifying the radio and an over-the-air code or key selector (KS). Decryption of an encrypted service is therefore only possible when all three co-parts are used together. The radio data system code (e.g., RDS PI code) is currently used for frequency modulation or FM broadcasting. To prepare for simulcast of a program over FM airway frequencies, the RDS PI code is provided in the ADF1 field by the service provider.

In accordance with an aspect of the present invention, a service 261 in a broadcast channel can be designated as a primary service of a multi-broadcast channel service. Accordingly, the effective bandwidth of a service 261 can be expanded by using the bandwidth of secondary services associated with the primary service. Together with the primary service, other broadcast channels carry the associated secondary services which can generally be received only by properly equipped radio receivers 29 (i.e., receivers equipped with more than one channel recovery device). The ADF1 field is provided with information to distinguish between primary and secondary services. This data preferably comprises a primary/secondary flag or PS flag and an Associated Service Pointer (ASP) field. The PS flag is preferably set to a 1(B) when the service 261 in the frame 100 belongs to a primary service, and is set to a 0(B) when the service 261 is not a primary service. In other words, the primary service is carried in the frames of another broadcast channel. The PS flag values and the ASP are indicated in Table 2.

TABLE 2

AUXILIARY DATA FIELD 1

| Assignment | Length (bit) | Contents |
|---|---|---|
| Not Used | 4 | 0000 |
| Primary/Secondary Flag (PS Flag) | 1 | 1: primary component 0: Not primary |
| Associated Service Pointer (ASP) | 11 | 000(hex): No link to other service else: Broadcast Channel Identifier of associated service (Refer to Time Slot Control Channel) |

Thus, the PS flag in the ADF1 of a SCH can be 0(B) if the service 261 is the component of a secondary service, or there are currently no primary and secondary services being transmitted. When a broadcast channel comprises a primary service, the ASP in the ADF1 field of the SCH of the frames 100 in the broadcast channel is provided with a broadcast channel identifier (BCID) of a secondary service. The BCID is described in further detail below. The ASP field in the ADF1 field of the SCH comprising the secondary service is provided with the BCID of the next secondary service, if more than two secondary services are associated with the primary service. The ASP is otherwise provide with the BCID of the primary service. Further, the PS flag in the ADF1 field of the SCHs of the frames 100 of other broadcast channels which comprise components of the secondary services is set to 0(B). The primary and secondary channels can be received by radio receivers 29 which are equipped with more than one channel recovery device. For example, these radio receivers can playback an audio program received on a first channel and a related video program received on another channel.

In accordance with another aspect of the present invention, another auxiliary data field referred to hereinafter as ADF2 and an auxiliary field content indicator for the ADF2, hereinafter referred to as the ACI2, is provided in the SCH 102 in each frame 100 of a single broadcast channel to transmit multiframe information in the ADF2 in other broadcast channel frames 100. The segments comprising the multiframe information need not be in continuous broadcast channel frames. The ACI2 comprises bits to indicate which of a number of 64 bit encryption keys is provided in the ADF2, as described above. The ACI2 can also be provided with a service label, such as an International Standards Organization label (e.g., as an ISO-Latin 1-Based Sequence). The ADF2 comprises a start flag (SF) and a Segment Offset and Length Field (SOLF), as indicated in Table 1. The SF is preferably 1 bit and is set to a first value such as "1" if the ADF2 comprises the first segment of a multiframe sequence. The ADF2 SF is set to "0", for example, to indicate that the contents of the ADF2 is an intermediate segment of a multiframe sequence. The SOLF is preferably 4 bits in length to indicate which of a total number of multiframe segments is presently provided in the ADF2 field. The SOLF can serve as an up-counter to indicate which of the total number of multiframe segments is currently being transmitted in the ADF2. The second auxiliary data field ADF2 is useful, for example, to transmit text messages along with the radio broadcast. The text messages can be displayed on a display device at the radio receivers 29.

With continued reference to Table 1, the service control header is also provided with information to control the reception of the individual service components within a broadcast channel frame at the radio receivers 29. The SCH is provided with a Number of Service Components ($N_{SC}$) field to indicate the number of service components (e.g., service components 260 and 262 in FIG. 13) which constitute the service portion 104 (FIG. 4) of a bit stream frame 100 generated at a broadcast station 23. The number of service components $N_{SC}$ is preferably represented in the SCH using 3 bits. Accordingly, in accordance with the preferred embodiment, a frame can have as many as eight service components. The padding bits, that is, the padding service component is preferably not included in the $N_{SC}$ parameter in the SCH. The SCH is further provided with a Service Component Control Field, hereinafter referred to as the SCCF, which comprises data for each component in the SCH. The SCCF is preferably $N_{SC} \times 32$ bits in length for each SCH. As stated above in connection with FIG. 14, each broadcast channel frame 100 can comprise two or more service components which are multiplexed in each of a plurality of data fields 270. With reference to Table 3, the SCCF comprises data for each service component in the SCH to facilitate the demultiplexing of the service components by the radio receivers 29. In other words, the SCH comprises a SCCF for each service component. In accordance with the present embodiment, the SCCF is the only part of the SCH that is specific to each service component.

TABLE 3

SERVICE COMPONENT CONTROL FIELD

| Field name | Length (bit) | Contents |
|---|---|---|
| SC length | 4 | Bit rate of the service component divided by 8 kbps: 0000: 8 kbps |

TABLE 3-continued

SERVICE COMPONENT CONTROL FIELD

| Field name | Length (bit) | Contents |
|---|---|---|
| | | 0001: 16 kbps |
| | | . . . |
| | | 1111: 128 kbps |
| SC type | 4 | Type of service component: |
| | | 0000: MPEG coded audio |
| | | 0001: general data (no specified format) |
| | | 0100: JPEG coded picture (TBC) |
| | | 0101: low bit rate video (H.263) |
| | | 1111: invalid data |
| | | else: RFU |
| Encryption flag | 1 | 0: Not encrypted service component. |
| | | 1: encrypted service component. |
| | | Note: If Encryption Control = 0, the encryption flag shall be ignored |
| Program type | 15 | Type of music, speech, etc. |
| Language | 8 | Service component language |

As shown in Table 3, each SCCF comprises a 4-bit service component or SC length field to indicate the bit rate of the service component divided by 8000 bps. For example, "0000(B)" can represent a SC length of 1×8000 bps, while "1111(B)" can represent a SC length of 16×8000 bps or 128,000 bps. The SC length field is important for demultiplexing at the radio receivers 29 since, without knowledge of the service component rate, the radio receivers 29 have no other means besides the size of the data fields 270 (FIG. 14) for determining where service components are located throughout a frame 100. Another field provided in each 32-bit SCCF is the SC Type field which is also preferably 4 bits in length. The SC Type field identifies the type of service component. For example, a "0001(B)" can represent a service component in the service portion 104 of a frame 100 which is MPEG-coded audio. Other binary numbers can be used in the SC Type field to indicate a service component as being a JPEG-coded picture, low bit rate video (e.g., CCITT H.263 standard video), invalid data (i.e., data that should be ignored by the receivers 29) or other type of audio or data service. A 1-bit encryption flag is provided in the SCCF to indicate whether or not a particular service component has been encrypted. The SCCF for each service component is also provided with a Program Type field comprising bits for identifying the type of program to which the service component belongs, and a Language field comprising bits to specify the language in which the program was produced. Program type can include, for example, music, speech, advertising for banned products and services, among others. Thus, countries which ban the use of alcohol can use the Program Type field to block the reception of alcohol-related advertisements transmitted by the broadcast stations 23 by programming receivers 29 to ignore broadcast data having a particular Program Type field code.

In accordance with the embodiment of the present invention described with reference to FIGS. 13–15 and Tables 1–3, each broadcast channel from a broadcast station 23 can have more than one service component (e.g., components 260 and 262). The waveform and signaling protocol of the present invention is advantageous for a number of reasons. First, the services 261 transmitted from different broadcast stations 23 need not be synchronized to the same single bit rate reference because each PRC is provided with a header which allows rate alignment on-board the satellite 25. Thus, the broadcast stations 23 are less complicated and less expensive because they need not be equipped with the ability to synchronize to a single reference source. The bits of each of the service components are multiplexed, that is, interleaved across an entire frame 100 to spread the service components over the entire frame 100. Thus, if a burst error occurs, for example, only a small portion of the service components are lost.

As stated previously, the SCH comprises four different types of field groups, three of which have been previously described. The auxiliary service-type field group comprises a dynamic label byte stream of variable length. The length of the dynamic label byte stream is preferably n×224−128− $N_{SC}$×32. The dynamic label byte stream is a serial byte stream used for transmitting auxiliary information. The dynamic labels can comprise text or radio screens and represent a general purpose serial byte stream. In other words, a dynamic label byte occurs over the entire broadcast channel, as opposed to being tuned to a particular service. For example, the dynamic label byte stream can transmit a menu of services for display on a screen at the radio receivers 29. Thus, the dynamic label byte stream represents another method in accordance with the present invention to communicate with a radio receiver outside the service portion 104 of each broadcast frame 100, along with the auxiliary data fields ADF1 and ADF2 described above.

Figure 13A:
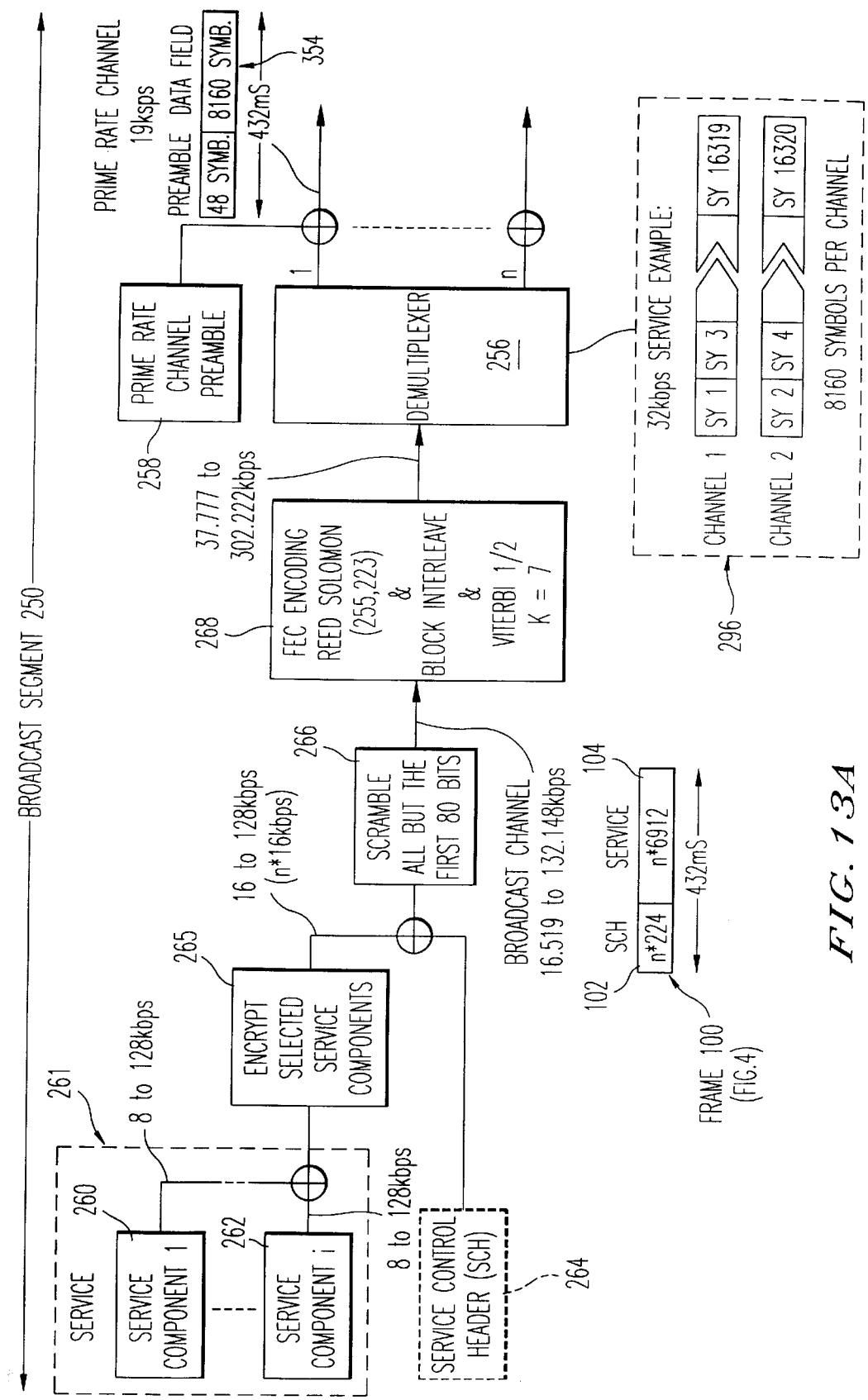
FIG. 13 is a schematic block diagram of the broadcast segment, space segment and radio segment of a system constructed in accordance with an embodiment of the present invention.
Figure 13B:
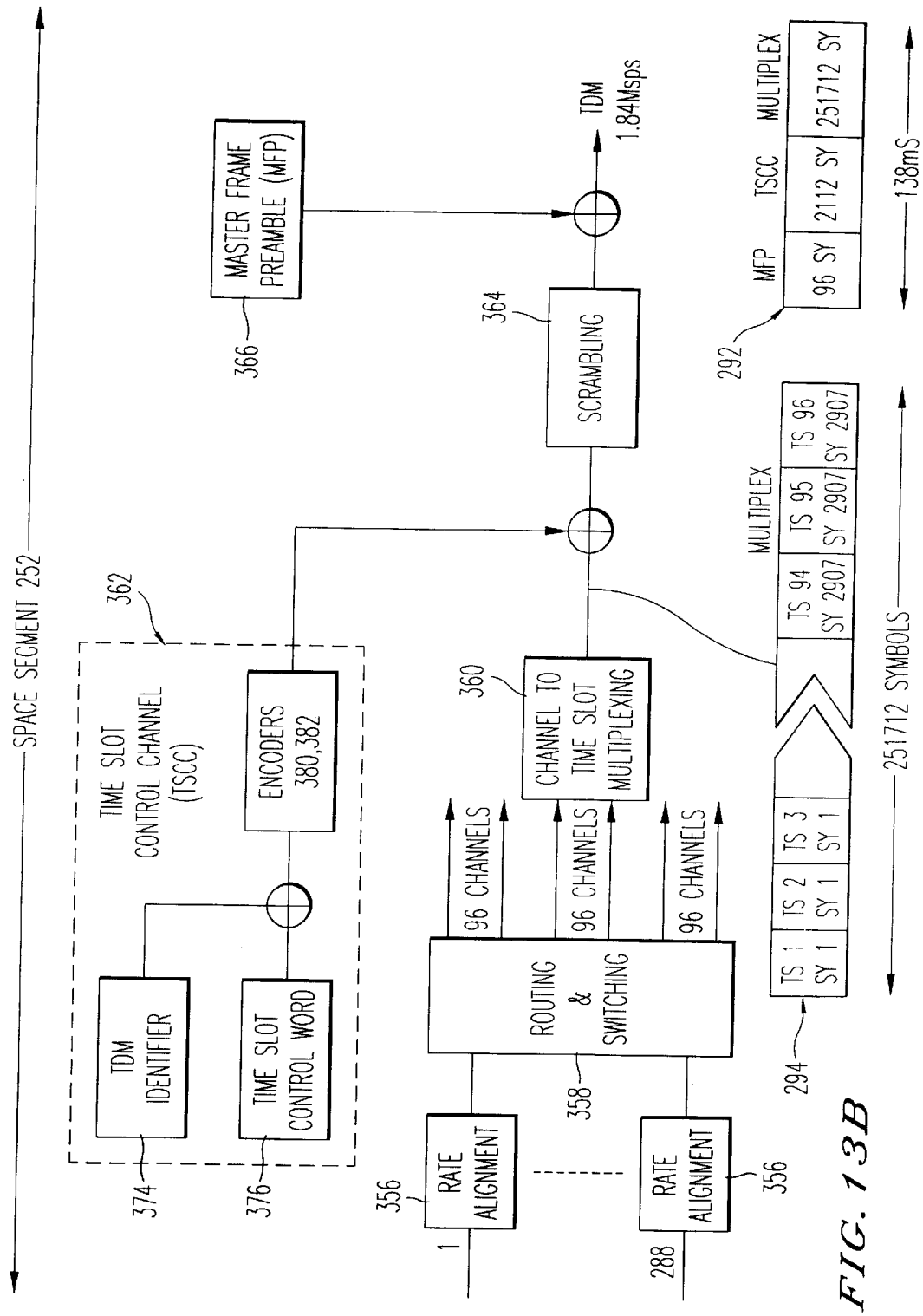
Figure 15:
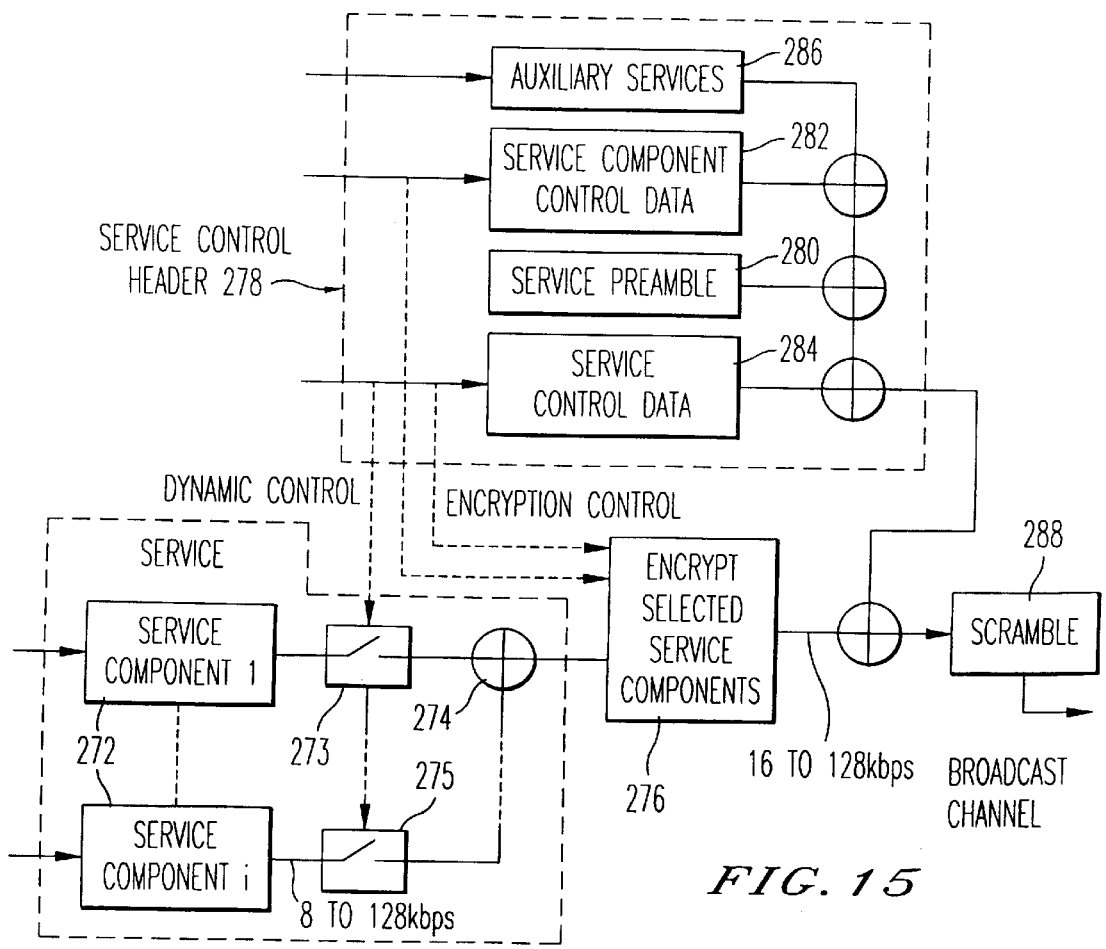
FIG. 15 is a schematic block diagram of the service layer of the broadcast segment of a system constructed in accordance with an embodiment of the present invention.

FIG. 15 provides a more detailed illustration of the components 261, 264, 265 and 266 provided in the service layer of the broadcast segment 250 depicted in FIG. 13. As shown in FIG. 15, a broadcast channel consists of one or more service components indicated generally at 272 which are combined, as indicated at 274. Selected service components can be encrypted, as indicated at 276, before a SCH 278 is appended to the service information. As described in connection with Table 1, the SCH 278 comprises a service preamble 280. The SCH 278 comprises service component control data 282, including the SCH field indicating the number of service components within a frame and the service component control field or SCCF. Service control data 284 generally includes the SCH fields comprising the BRI and encryption control. Finally, the SCH 278 provides auxiliary services 286 which include the auxiliary data fields ADF1 and ADF2 and their associated fields ACI1 and ACI2, respectively, as well as the start flag and SOLF corresponding to the data field ADF2. Auxiliary services 286 also comprises the dynamic label byte stream available in the SCH. The auxiliary services 286 provide means to communicate with radio receivers via several frames within a broadcast channel, as is the case with auxiliary data field ADF2, within the SCHs of two or more broadcast channels, as is the case with the auxiliary data field ADF1, and across the entire broadcast channel, as is the case of the dynamic label byte streams. The service information and the appended SCH is subsequently scrambled, as indicated by 288.

Figure 16:
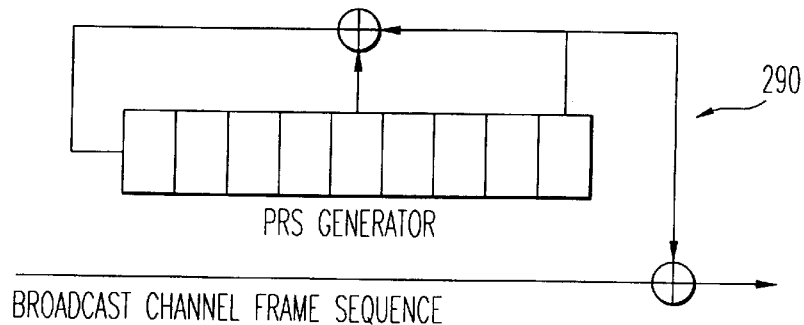
FIG. 16 is a schematic diagram of a pseudorandom sequence generator used for scrambling broadcast channels in accordance with an embodiment of the present invention.

A pseudorandom sequence (PRS) generator or scrambler 290, such as that shown in FIG. 16, is preferably used to randomize the data of a broadcast channel. The scrambler 290 is preferably used even when a service is encrypted. The scrambler produces a pseudorandom sequence that is bit-per-bit modulo 2 added to the broadcast channel frame sequence. The pseudorandom sequence preferably has a generated polynomial $X^9+X^5+1$. The pseudorandom sequence is initialized at each frame 100 with the value 111111111(binary) which is applied to the first bit of a frame 100. Thus, the scrambler 290 generates a reproducible random bit stream which is added to the broadcast bit stream at the broadcast stations 23 in order to scramble or break-up strings of bits having a pattern of 1s or 0s which can cause demodulation at a radio receiver 29 to fail. The same reproducible random bit stream is added a second time at the radio receivers 29 to essentially subtract the bit stream from the received data.

Figure 17:
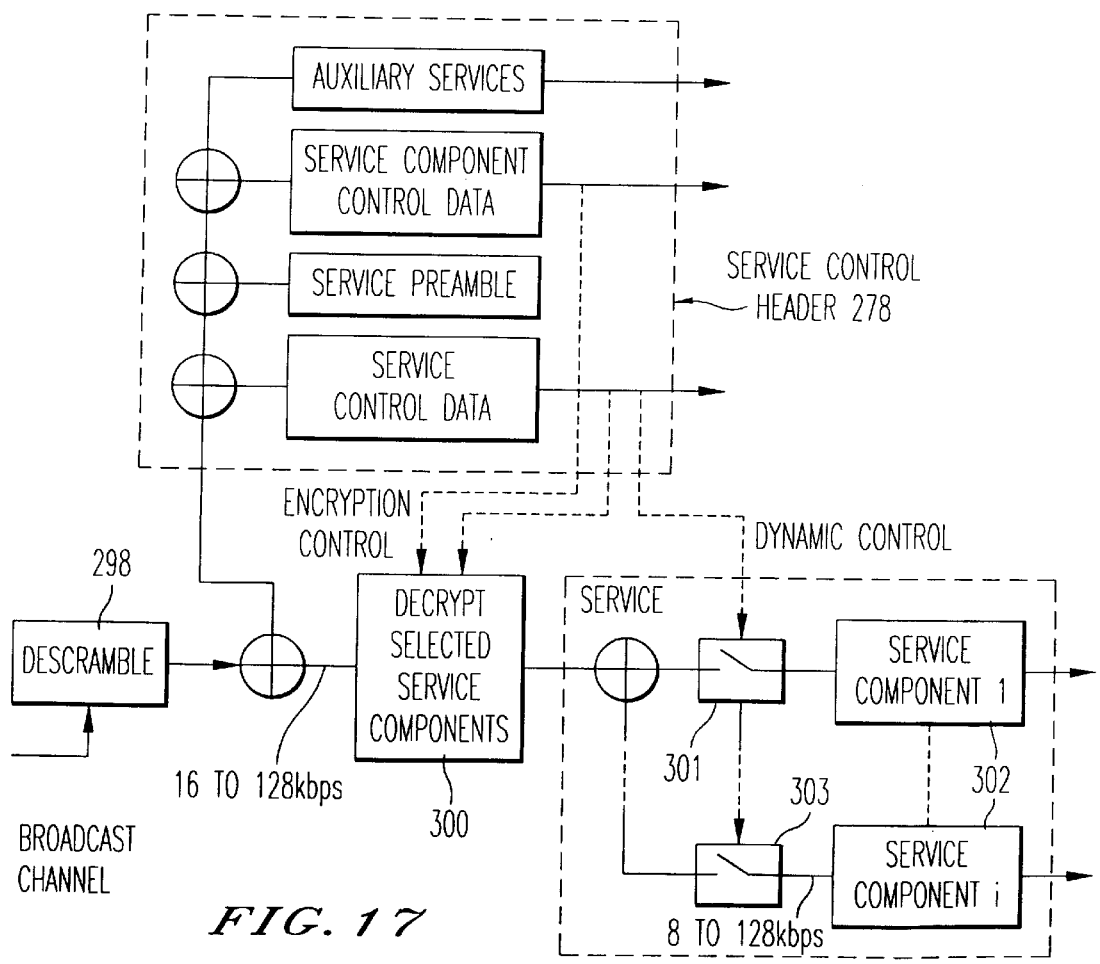
FIG. 17 is a schematic block diagram of the service layer of the radio segment of a system constructed in accordance with an embodiment of the present invention.

With reference to FIG. 13, the transport layer of the radio segment 254 which is required to extract symbols from received TDM data streams, as indicated at 292 and 294, and to recombine symbols into their respective broadcast channels, as indicated at 296, is described above in connection with FIG. 10. With regard to the service layer of the radio segment 254 (FIG. 13), the service components from the service portion 104 of a frame 100 and the SCH 102 will now be described in connection with FIG. 17.

The bit stream comprising multiple frames 100 is de-scrambled using a modulo 2 scrambler 290 as described above in connection with FIG. 16 to subtract the pseudo-random sequence from the incoming bit stream, as indicated at 298. The service control header 278 is then extracted prior to the decryption of those service components that were encrypted at the broadcast stations 23, as indicated at 300. As shown in both FIGS. 15 and 17, dynamic control is provided for each service, as indicated at blocks 273 and 275 in FIG. 15 and blocks 301 and 303 in FIG. 17, to allow a service provider to selectively control the content of the SCH 278. In other words, a service provider can change encryption control information in the SCH on a frame-by-frame basis, or even on a service component-to-service component basis. Similarly, a service provider can change the contents of the auxiliary data fields ADF1 and ADF2 and their corresponding associated fields (i.e., ACI1 for the ADF1, and ACI2, SF and SOLF for the ADF2). As stated previously, the association of a primary broadcast service with one or more secondary broadcast services can be changed dynamically, as can the transmission of multiframe sequences of information using the field ADF2, in addition to encryption control.

Figure 18:
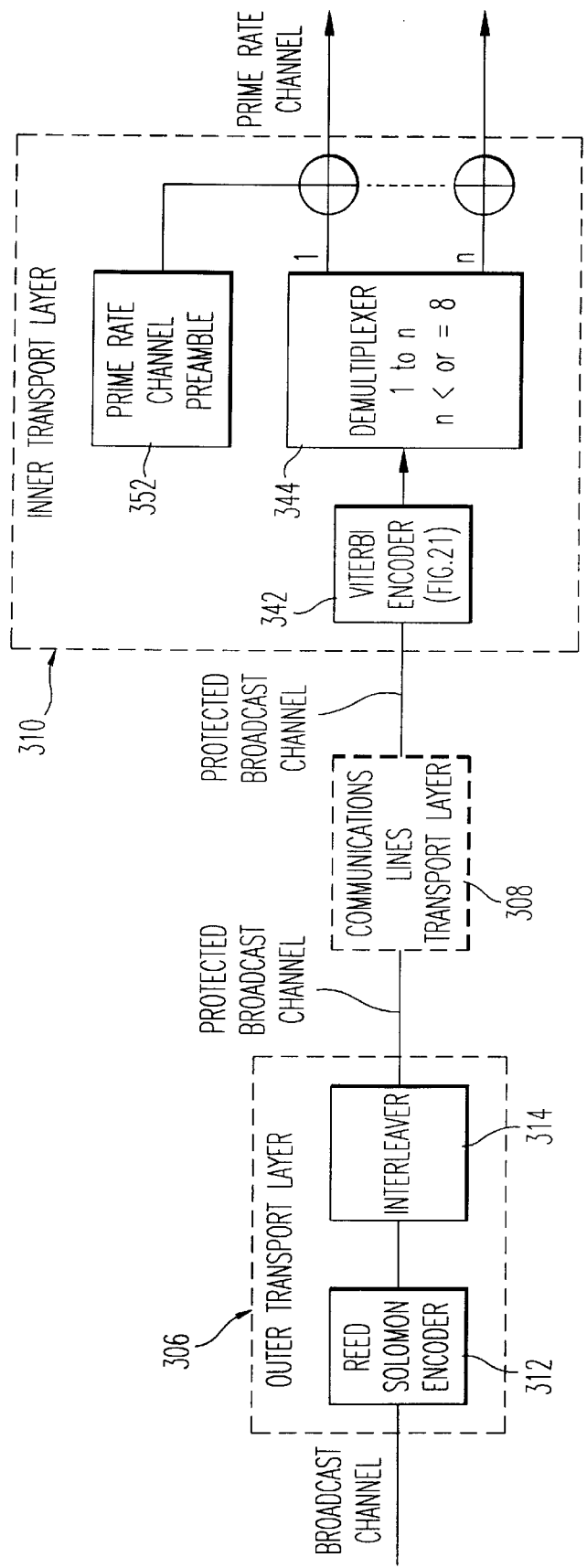
FIG. 18 is a schematic block diagram of the transport layer of the broadcast segment of a system constructed in accordance with an embodiment of the present invention.
Figure 20A:
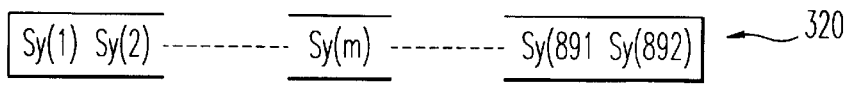
FIG. 20 is a diagram illustrating interleaving of symbols in a prime rate channel in accordance with an embodiment of the present invention.
Figure 20B:
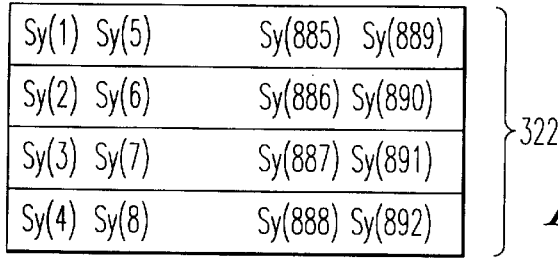
Figure 20C:
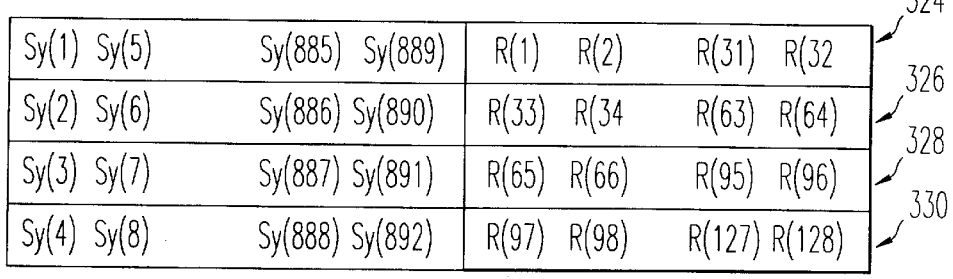
Figure 20D:
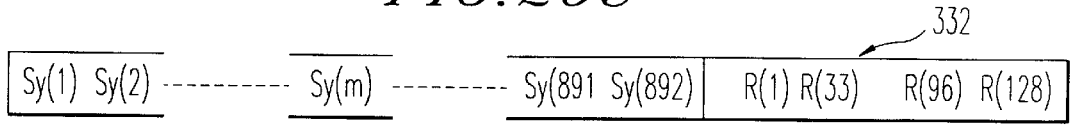
Figure 22A:
FIG. 22 is a diagram depicting the demultiplexing of a broadcast channel into prime rate channels in accordance with an embodiment of the present invention.
Figure 22B:
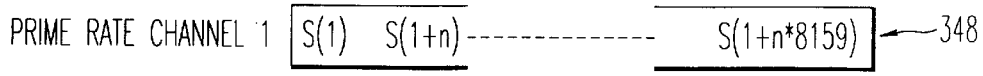
Figure 22C:
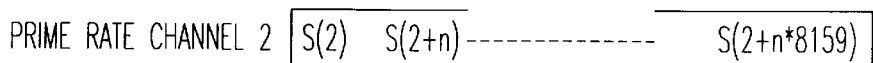
Figure 22D:
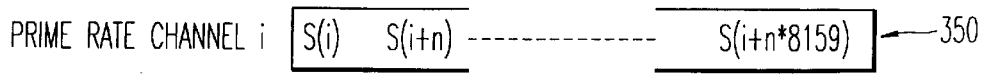
Figure 22E:
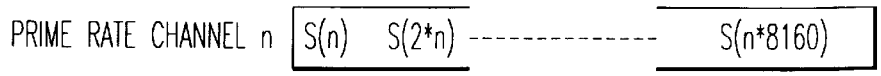

The transport layer of the broadcast segment 256, as opposed to the service layer described above in connection with FIG. 15, will now be discussed in connection with FIG. 18. The transport layer of the broadcast segment 250 preferably comprises an outer transport layer 306, a communications lines transport layer 308 and an inner transport layer 310. The outer transport layer 306 can be located remotely with respect to the inner transport layer 310. The communications lines transport layer 308 includes all functionalities necessary for transmission over communication lines. Within the transport layer, a broadcast channel is preferably encoded for forward error correction (FEC) using concatenated Reed-Solomon encoding and interleaving, as indicated generally at 312 and 314, prior to being demultiplexed into primary channels having a service rate equivalent to 16 kilobits per second. Accordingly, the FEC-encoded broadcast channel is transmitted as a protected broadcast channel between the outer transport layer 306 and the inner transport layer 310, as shown in FIG. 18.

FIG. 19 illustrates the bit stream processed by the outer transport layer 306, as well as the bit stream processed by the inner transport layer 310. The broadcast channel 316 and the prime rate channels 318 are preferably derived from the same clock reference. Further Reed-Solomon encoding and interleaving are preferably synchronized with the SCH. The prime rate channels of a broadcast channel are preferably time synchronized such that the location of the service preamble described above in connection with Table 1 is referred to as the prime rate channel preamble, as illustrated in FIG. 4.

The Reed-Solomon (255,223) encoding 312 performed at the broadcast stations 23 (e.g., 80a in FIG. 3) is preferably performed in terms of 8 bit symbols and used as the outer code of the concatenated coding process.

The code generator polynomial is preferably:

$$g(x) = \prod_{j=0}^{31}(x - \alpha^j)$$

where $\alpha$ is a root of $F(x)=x^8+x^4+x^3+x^2+1$.

Coding is performed using the basis $\{1, \alpha^1, \alpha^2, \alpha^3, \alpha^4, \alpha^5, \alpha^6, \alpha^7\}$.

Each symbol is interpreted as:

$[u_7, u_6, u_5, u_4, u_3, u_2, u_1, u_0]$, $u_7$ being the most significant bit (MSB), where the $u_i$ are the coefficients of $\alpha^i$, respectively:

$u_7*\alpha^7+u_6*\alpha^6+u_5*\alpha^5+u_4*\alpha^4+u_3*\alpha^3+u_2*\alpha^2+u_1*\alpha+u_0$ The code is systematic, that is, the first 223 symbols are the information symbols. Prior to encoding, the first symbol in time is associated to $x^{222}$ and the last symbol to $x^0$. The 32 last symbols are the redundancy symbols. Following encoding, the first symbol in time is associated with $x^{31}$ and the last symbol to $x^0$.

A block Interleaver, with a depth of preferably 4 Reed-Solomon (RS) blocks, is used as the Interleaver 314 in the concatenated coding process. RS coding 314 and interleaving 314 are preferably as follows:

Assuming that Sy(m) is the m-th 8 bit symbol among 892 symbols 320 to be RS encoded, as shown in FIG. 20, the RS encoding is performed on the following 4 sets of 223 symbols, as indicated at 322 in FIG. 20.

Set 1: Sy(1), Sy(5), Sy(9), . . . , Sy(1+4*m), . . . , Sy(889); m from 0 to 222

Set 2: Sy(2), Sy(6), Sy(10), . . . , Sy(2+4*m), . . . , Sy(890); m from 0 to 222

Set 3: Sy(3), Sy(7), Sy(11), . . . , Sy(3+4*m), . . . , Sy(891); m from 0 to 222

Set 4: Sy(4), Sy(8), Sy(12), . . . , Sy(4+4*m), . . . , Sy(892); m from 0 to 222

Each set is increased by the following 32 symbols (8 bit) of redundancy data, as indicated at 324, 326, 328 and 330 in FIG. 20.

Set 1: R(1), R(2), R(3), . . . , R(32)

Set 2: R(33), R(34), R(35), . . . , R(64)

Set 3: R(65), R(66), R(67), . . . , R(96)

Set 4: R(97), R(98), R(99), . . . , R(128)

Accordingly, the output symbol stream 332 has the following content, as shown in FIG. 20, Sy(1), Sy(2), Sy(3), . . . , Sy(892), R(1), R(33), R(65), R(97), R(2), R(34), R(66), . . . , R(j), R(j+32), R(j+64), R(j+96), . . . , R(32), R(64), R(96), R(128), with j from 1 to 32. Thus, the protected broadcast channel frame receives 1024 bits per 7136-bit broadcast channel 316 due to Reed-Solomon redundancy, as indicated at 334 in FIG. 19. The first bit of Sy(1) is preferably the first bit of the Service Preamble (Table I) of the broadcast channel.

With regard to the interleaving 314 performed in the outer transport layer 306 at the broadcast stations 23, a Viterbi convolutional code (rate ½, k=7), as indicated in FIG. 21, is preferably used as the inner code of the concatenated coding process of the outer transport layer 306. The generator polynomials are $g_1$=1111001 binary (B) and $g_2$=1011011 (B). Each block 336 in FIG. 21 represents a single bit delay. Modulo 2 adders indicated at 338 and an inverter 340 are implemented such that the output of the encoder depicted in FIG. 21 is preferably $g_1$ and $g_2$. For every input bit, a symbol is preferably generated with the switch "Sw" in position 1 and then in position 2.

The Viterbi encoder 342 depicted in FIG. 18 generates bit streams which are subsequently demultiplexed in the inner transport layer 310. The demultiplexer 344 preferably divides encoded broadcast channels into prime rate channels, each of which has a bit rate of 38000 bps, as shown in FIG. 22. With reference to FIG. 19, the protected broadcast channel frame comprises a total of n×8160 bits, that is, n×7136 bits for the broadcast channels and 1024 bits for Reed-Solomon redundancy, as indicated at 346 in FIG. 22. For the purposes of demultiplexing, symbols S(1), S(2) and so on are two-bit symbols from the FEC-encoded broadcast channel. S(1) is preferably the first symbol to be inserted into the first prime rate channel, as indicated at 348 in FIG. 22. Thus, demultiplexing causes the content of the $i^{th}$ prime rate channel to be S(i), S(i+n), S(i+2*n), . . . , S(i+p*n), . . . , S(i+8159*n), with p from 0 to 8159, as indicated at 350 in FIG. 22. The broadcast channels are preferably demultiplexed into n prime channels. The number of bits from the FEC-encoded broadcast channel provided in each prime rate channel is preferably 16,320 bits per frame period. The prime rate channels are then each provided with a prime rate channel preamble, as indicated at 352 in FIG. 18. The prime rate channel preambles within a broadcast channel are all preferably time coincident. The prime rate channel preamble length is preferably 96 bits or 48 symbols, as described above in connection with FIG. 4. The prime rate channel preamble value is preferably 14C181EAC649 (hexadecimal), with the most significant bit being the first transmitted bit. The prime rate channel preamble is preferably composed of the same time coincident 48 bit sequence on both the I and the Q components of the QPSK modulation 86 (FIG. 3).

When a protected broadcast channel is not available, a dummy broadcast channel is preferably generated within the inner transport layer 310. The dummy protected broadcast channel has the same bit rate and the same frame period as the broadcast channel it replaces. The dummy protected broadcast channel includes a pseudorandom sequence and a SCH limited to a service preamble, as described previously, and a BRI filled with 0s. The pseudorandom sequence is created using a generator such as the PRS generator 290 depicted in FIG. 16, as well as using the same generator polynomial described above.

As stated previously, the communications lines transport layer 308 is preferably transparent to the protected broadcast channel digital format. This layer 308 performs the connection between the inner and outer transport layers 310 and 306, respectively, which can be located in separate sites. Accordingly, the communications lines transport layer 308 can include communications lines. The outer transport layer 306 is used to protect a signal from errors coming from the communications lines. If errors issued from the communications lines are numerous, a greater level of protection is possible. For example, the protected broadcast channel can be protected by another FEC code, or the received protected broadcast channel can be Reed-Solomon decoded and corrected, and then Reed-Solomon encoded prior to reaching the inner transport layer 310.

As previously described, the system 10 of the present invention comprises a processed mission and a transparent mission. The transport layer of the broadcast segment 250 of the transparent mission preferably comprises the broadcast segment transport layer and the space segment transport layer of the processed mission. Much of the re-alignment of the broadcast signals (i.e., the rate alignment of frames on-board the satellite 25), however, is not necessary in the transparent mission because all of the broadcast channels therein originate from a common hub. Thus, time differences between a plurality of broadcast stations 23 do not exist.

Figure 23:
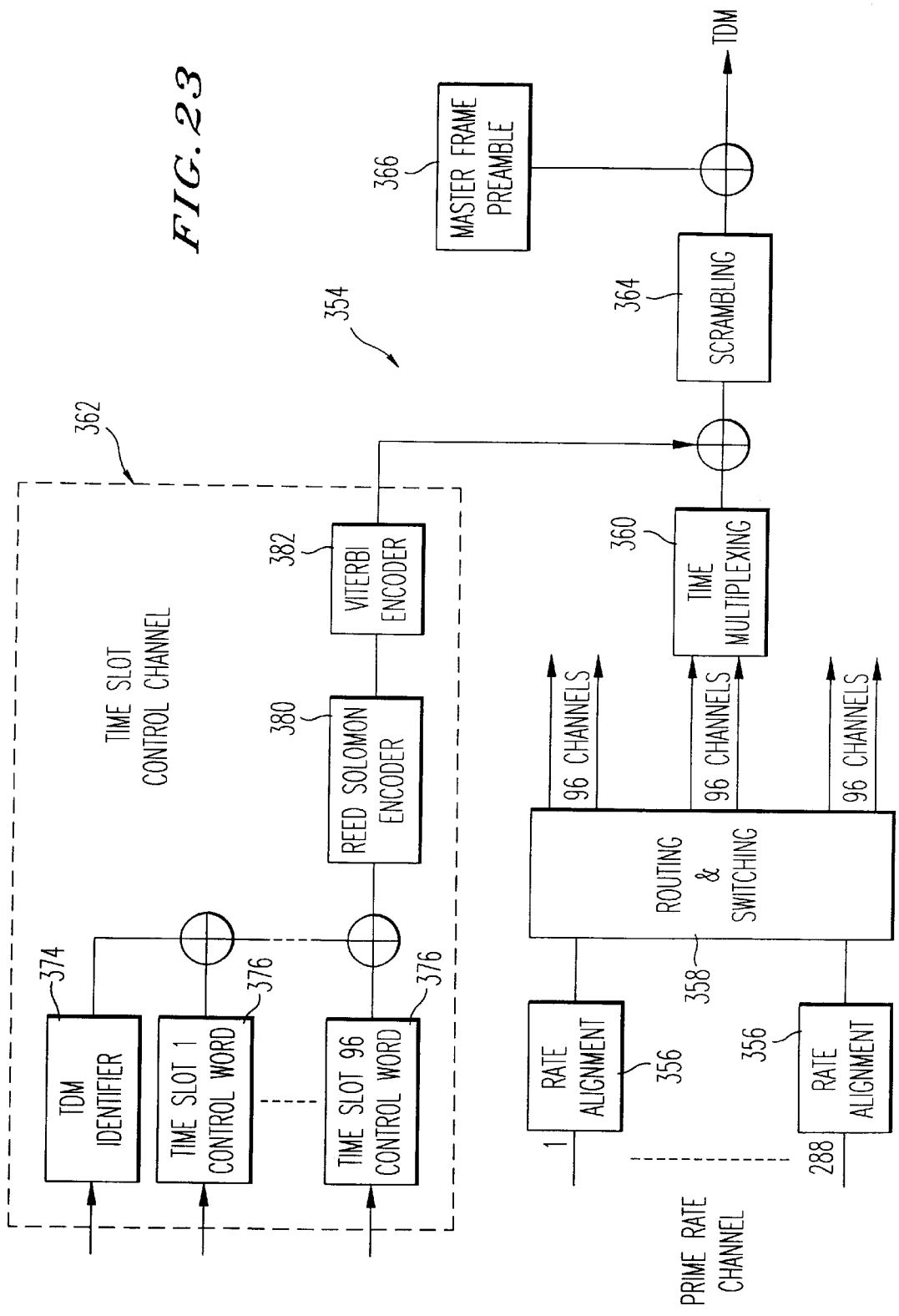
FIG. 23 is a schematic block diagram of the transport layer of the space segment of a system constructed in accordance with an embodiment of the present invention.
Figure 24:
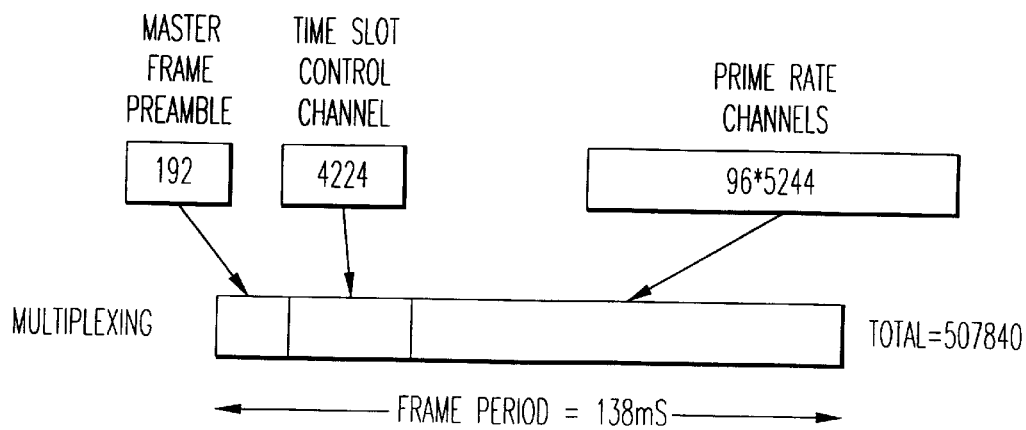
FIG. 24 is a diagram depicting a time division multiplex downlink signal generated in accordance with an embodiment of the present invention.

The transport layer of the space segment 252 depicted generally in FIG. 13 will now be described. The space segment transport layer receives prime rate channels from the broadcast stations 23, as indicated at 354 in FIG. 13. The space segment transport layer, hereinafter referred to generally as 356, is illustrated in FIG. 23. As described above in connection with FIG. 7, prime rate channels are rate aligned prior to being routed into a selected downlink beam and multiplexed for time division multiplex downlink transmission. The rate alignment process is indicated generally at 356 in FIG. 23. The switching and routing performed on-board the satellite and described above in connection with FIG. 8 is indicated at 358 and the time division multiplexing at 360. A time slot control channel 362 is inserted in the time division multiplexed or TDM bit stream at the space segment 252 level. The time slot control channel (TSCC) will be described in more detail below. The multiplex prime rate channels and the TSCC 362 are scrambled, as indicated at 364, prior to having a master frame preamble appended thereto, as indicated at 366, which is used for TDM synchronization at the radio receivers 29. The TDM frame period is preferably 138 milliseconds, as shown in FIG. 24. The master frame preamble is preferably 192 bits or 96 symbols in length. The time slot control channel preferably includes 4224 bits.

Figure 25A:
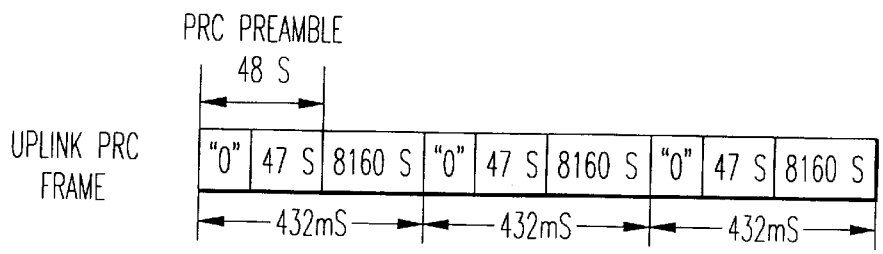
FIG. 25 is a diagram illustrating rate alignment performed on-board a satellite in accordance with an embodiment of the present invention.
Figure 25B:
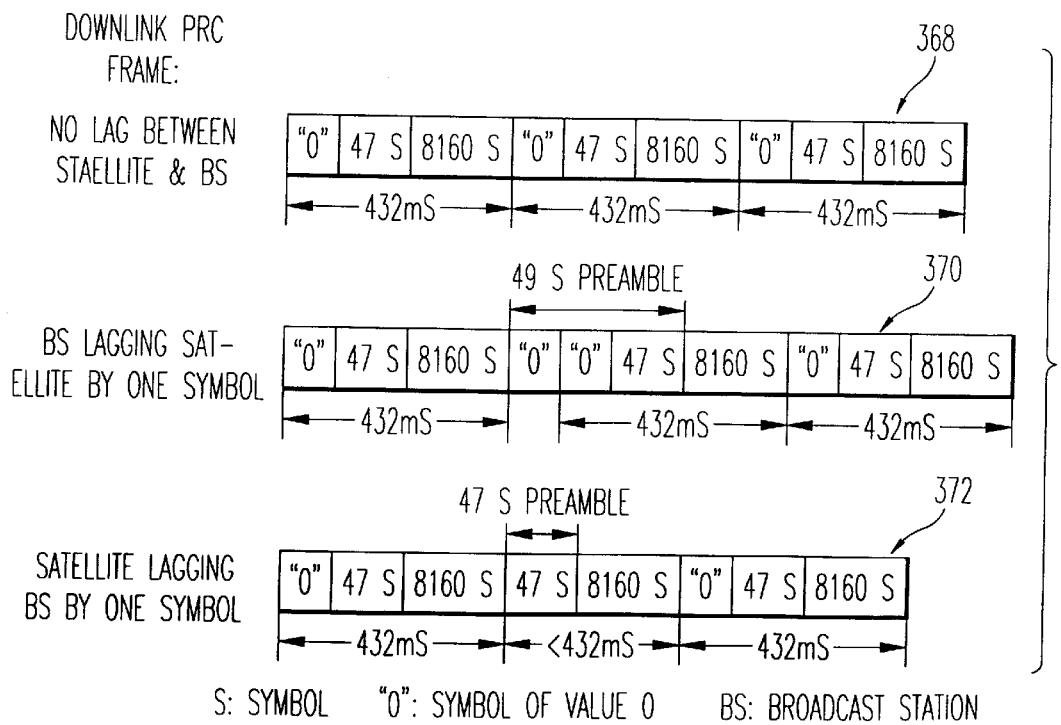

The symbol rate alignment process performed on-board the satellite 25 and described above in connection with FIG. 7 will now be illustrated using FIG. 25. Rate alignment occurs between independent uplink channels received from broadcast stations 23 to correct for time differences between the bit rate reference for the various broadcast stations 23 and the satellite TDM rate reference. The rate alignment process is advantageous because it eliminates the need to synchronize all broadcast stations 23 to a single bit rate reference. Thus, the broadcast stations can be operated using less complicated equipment and therefore at lower cost. As described above in connection with FIG. 7, the rate alignment process consists of adjusting the length of the prime rate channel preamble by adding a bit, withdrawing a bit, or performing neither the adding or withdrawing of a bit, at the beginning of a preamble. The PRC bit stream 368 depicts when no lag exists between the satellite bit rate reference and that of the broadcast station 23 transmitting the received prime rate bit channel or PRC bit stream. The PRC bit stream indicated at 370 illustrates the insertion of a 0 into a preamble, resulting in a 49 symbol preamble to correct for when the broadcast station bit rate reference lags behind that of the satellite by one symbol. When the satellite bit rate reference lags behind that of the broadcast station by one symbol, a 0 is removed from a 48 symbol PRC preamble, resulting in a 47-symbol preamble, as indicated at 372.

Figure 26:
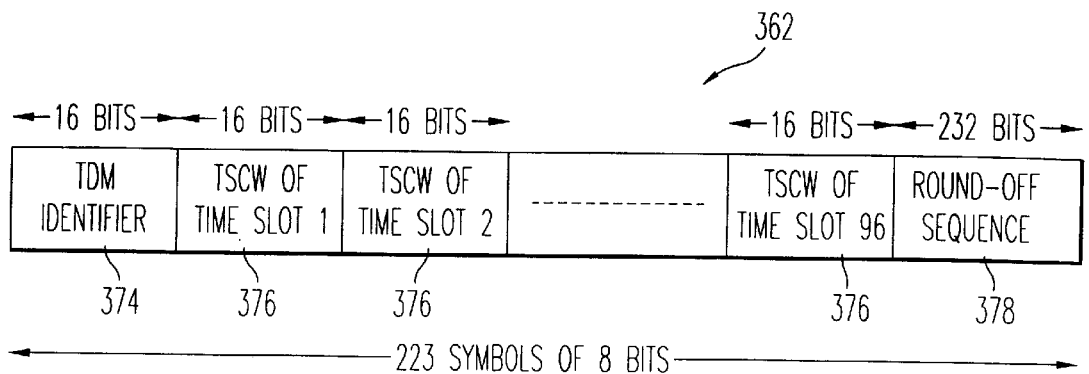
FIG. 26 is a diagram depicting a time slot control word inserted in a time division multiplex downlink bit stream in accordance with an embodiment of the present invention.

With continued reference to FIG. 23, the TSCC 362 preferably comprises a TDM identifier 374, and a time slot control word 376 for each of the time slots 1 through 96. The TSCC 362 is depicted in FIG. 26. The TSCC multiplex 362 preferably comprises 223 symbols of 8 bits per symbol. The TDM identifier 374 and the time slot control word or TSCW 376 for each of the 96 time slots are preferably 16 bits long each. The TSCC multiplex 362 further comprises a set of 232 bits which constitute a round-off sequence 378. The round-off sequence 378 comprises 0s for the odd bits and is for the even bits. The first bit that is transmitted is preferably the most significant bit and is also a 1. The time slot control word for each of the 96 time slots comprises fields, as indicated in Table 4.

TABLE 4

TIME SLOT CONTROL WORD

| Field Group | Field name | Length (bit) | Contents |
|---|---|---|---|
| Broadcast Channel Identifier (BDIC) | BCID type | 2 | 00: Local BCID<br>01: Regional BCID<br>11: Worldwide BCID<br>10: Extension to Worldwide BCID |
| | BCID number | 9 | 000000000: Reserved for unused channels<br>111111111: Reserved for Test Channel |
| — | Last Prime Rate Channel flag | 1 | 0: Not last Prime Rate Channel of the Broadcast Channel<br>1: Last Prime Rate Channel of the Broadcast Channel |
| — | Format identified | 2 | 00: WorldStar 1<br>else: RFU |
| — | Broadcast Audience | 1 | 0: Public audience<br>1: Private audience |
| — | Reserved | 1 | RFU |

Each broadcast channel is preferably identified by a unique broadcast channel identifier (BCID) which is composed of a BCID type and a BCID number. BCID types preferably include a local BCID, a regional BCID, a worldwide BCID, and an extension to worldwide BCID. A worldwide BCID indicates that the BCID for that particular broadcast channel is valid for any time division multiplexed bit stream in any geographic region. In other words, the BCID uniquely identifies that particular broadcast channel to radio receivers 29 located anywhere in the world and on any time division multiplex carrier on any downlink beam. As stated previously, each satellite 25 is preferably configured to transmit signals on three downlink beams, each of which has two differently polarized TDM carriers, as discussed below. A regional BCID is valid for a specific geographic region such that the same BCID can be used to uniquely identify another broadcast channel in another geographic region. A regional BCID is valid on any TDM downlink in that particular region. A local BCID is valid for only a particular TDM carrier in a particular region. Thus, the same BCID can be used on another beam within the same geographic region or in another region to identify other broadcast channels.

With continued reference to Table 5, the content of the TDM identifier 374 includes a region identifier and a TDM number. The region identifier uniquely identifies the region of a received TDM bit stream. For example, one region can be the geographic region serviced by the downlink of a first satellite which has coverage over much of the African continent. The region identifier can also uniquely identify regions serviced by satellites covering Asia and the Caribbean region, respectively. The TDM number field in the TDM identifier 374 defines a particular TDM bit stream. Odd TDM numbers are preferably used for left hand polarized (LHCP) TDMs and even TDM numbers for right hand polarized (RHCP) TDMs.

TABLE 5

TDM IDENTIFIER

| Field name | Length (bit) | Contents |
|---|---|---|
| Region Identifier | 4 | 0000: Reserved<br>0001: AfriStar<br>0010: AsiaStar<br>0100: CaribStar<br>else: RFU |
| TDM number | 4 | 0000: Reserved<br>0001: TDM 1 (LHCP)<br>0010: TDM 2 (RHCP)<br>. . .<br>0110: TDM 6 (RHCP)<br>else: RFU<br>Note: Odd TDM numbers are used for Left Hand polarized (LHCP) TDMs, and even TDM numbers are used for Right Hand polarized (RHCP) TDMs |
| Reserved | 6 | RFU |

The TSCC multiplex is preferably also encoded using Reed-Solomon (255, 223) encoding on 8 bit symbols, as indicated at block 380 in FIG. 23. The code generator polynomial is preferably $$g(x) = \prod_{j=112}^{143} (x - \alpha^{11j})$$

where $\alpha$ is a root of $F(x)=x^8+x^7+x^2+x+1$. Coding is performed using the basis $\{1, \alpha^1, \alpha^2, \alpha^3, \alpha^4, \alpha^5, \alpha^6, \alpha^7\}$. Each symbol is interpreted as:

[$u_7, u_6, u_5, u_4, u_3, u_2, u_1, u_0$], $u_7$ being the MSB, where the $u_i$ are the coefficients of $^i$, respectively:
$u_7*\alpha^7+u_6*\alpha^6+u_5*\alpha^5+u_4*\alpha^4+u_3*\alpha^3+u_2*\alpha^2+u_1*\alpha+u_0$.

The Reed-Solomon code is systematic in that the first 223 symbols, composing the TSCC multiplex are the information symbols prior to encoding. The first symbol in time is associated with $x^{222}$, and the last symbol with $x^0$. The 32 last symbols are the redundancy symbols following encoding. The first symbol in time is associated with $x^{31}$, and the last symbol with $x^0$.

No interleaving is applied prior to Viterbi encoding 382, as depicted in FIG. 23. Prior to Viterbi encoding, a round-off set of 72 bits is added following the Reed-Solomon block of 255 symbols. The 72 bit round-off set comprises all odd bits at "0" and all even bits at "1". The first bit to be transmitted is the MSB, that is, a "1". A Viterbi encoding with R=½ and k–7 is used with the same characteristics as described above in connection with Viterbi encoding at the broadcast stations 23. Viterbi encoding is synchronized to the Master Frame Preamble so that the first bit following the Master Frame Preamble is the first bit issued from the Viterbi encoder, which is affected by the first bit of the RS encoded data. During initialization of the Viterbi encoder, which takes place before the first bit of the multiplex bit stream following the Master Frame Preamble, the registers within the Viterbi encoder are set to zero.

Figure 27:
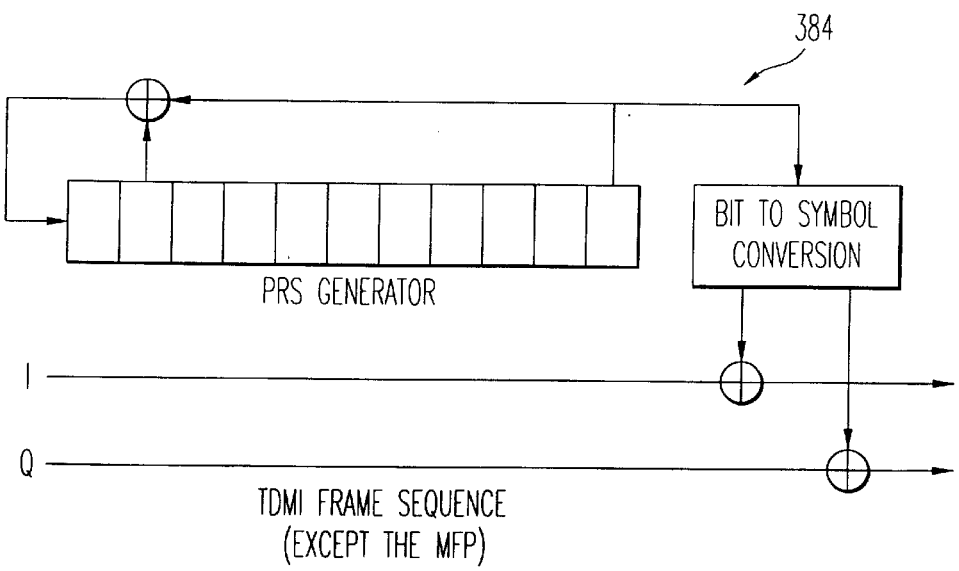
FIG. 27 is a schematic diagram of a time division multiplex frame sequence generator used in accordance with an embodiment of the present invention.

As indicated in block 366 of FIG. 23, a master frame preamble is inserted in the serial symbol TDM stream. The master frame preamble comprises a unique word and is preferably composed of the same time synchronized 96-bit sequence on both the I and Q components of the QPSK modulated signals. The scrambling process (block 364) can be implemented using a PRS generator 384 depicted in FIG. 27 to randomize the data in a TDM carrier. The scrambler 384 produces a pseudorandom sequence which is preferably symbol-per-symbol space modulo 2 added to the TDM frame sequence. A symbol of the pseudorandom sequence is composed of two successive bits coming from descrambler 384. The pseudorandom sequence can have a generator polynomial such as $x^{11}+x^2+1$. The pseudorandom sequence can be initialized at each frame with a value such as 11111111111(binary) which is applied to the first bit of the I component following the master frame preamble.

Figure 28A:
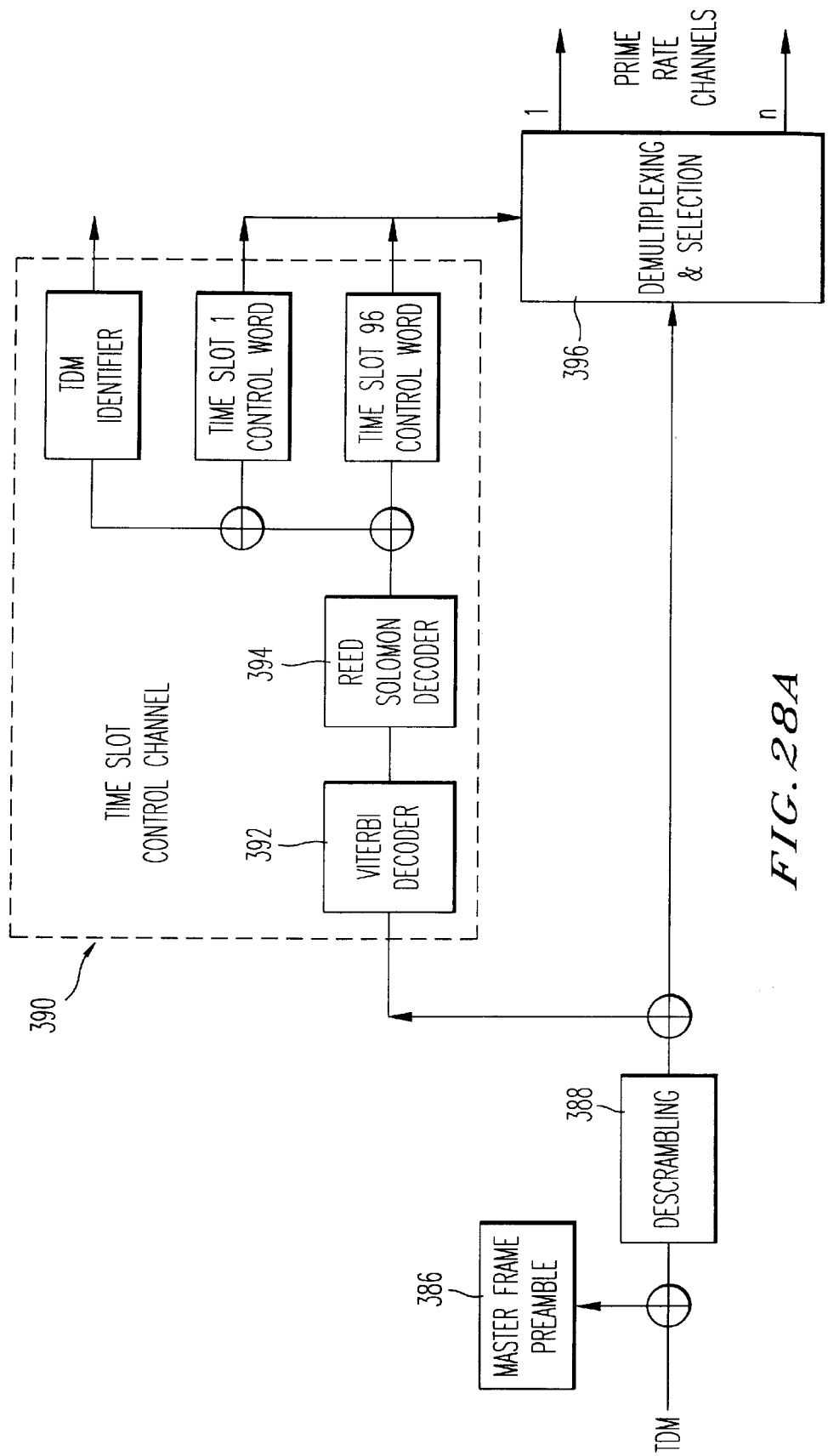
FIGS. 28a and 28b are schematic block diagrams of the transport layer of the radio segment in a system constructed in accordance with an embodiment of the present invention.
Figure 28B:
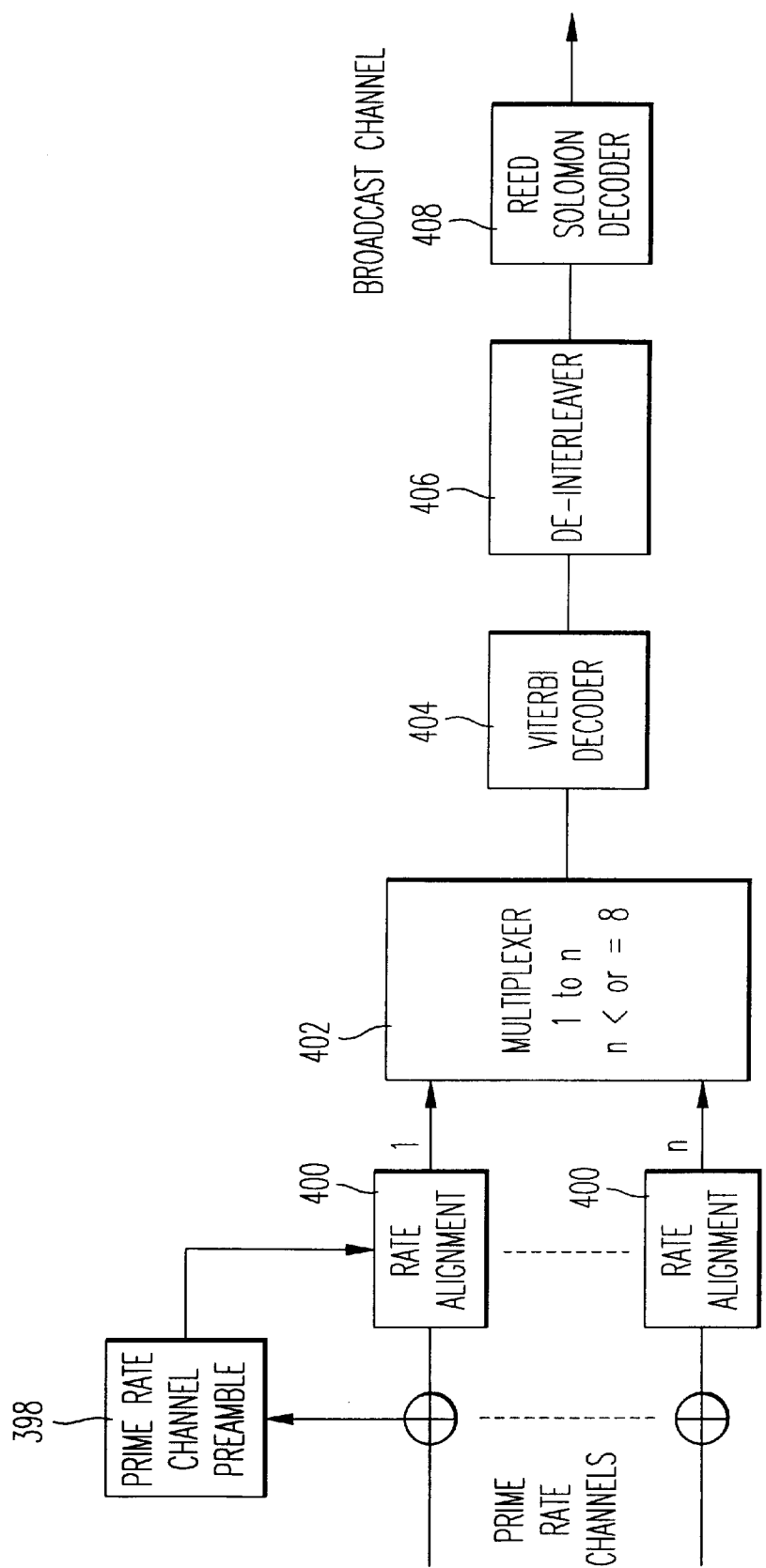

The transport layer of the radio segment 254 is depicted in FIGS. 28a and 28b. The radio segment transport layer receives the TDM master frame preamble (block 386) from the physical layer of the radio receiver 29. The operations performed at the transport layer are essentially the inverse of those performed in the space segment (FIG. 23) and the broadcast segment (FIG. 18). Following descrambling (388), data from the time slot control channel (390) is used to identify and select TDM time slots belonging to the same broadcast channel to which the radio receiver is tuned. A Viterbi decoder (block 392) is used to remove the encoding performed on-board the satellite and described above in connection with block 382 in FIG. 23. Further, a Reed-Solomon decoder (block 394) decodes the encoding performed on-board the space craft and described in connection with block 380 in FIG. 23. The TDM time slots belonging to a selected broadcast channel are then demultiplexed to obtain the prime rate channels, as indicated in block 396. The demultiplexing is illustrated by blocks 294 and 296 in FIG. 13, as well as being described in connection with FIG. 10. With reference to blocks 398 and blocks 400 in FIG. 28b, the prime rate channels are rate-aligned using the headers of the individual prime rate channels, as described above in connection with FIG. 11. Following prime rate channel synchronization and re-multiplexing (block 402) Viterbi decoding (block 404) is performed to remove the encoding performed in the transport layer of the broadcast segment and described in connection with block 342 in FIG. 18. The symbols are subsequently de-interleaved (block 406) and decoded using a Reed-Solomon decoder (block 408), which is the reverse processing of the broadcast channels performed in the outer transport layer 306 of the broadcast segment to obtain the broadcast channel. Thus, a received time division multiplexed bit stream is descrambled to correct for errors in the TDM transmission, decoded to recover the broadcast channel and then descrambled to correct for broadcast channel errors.

In accordance with another aspect of the signaling protocol of the present invention, TDM signals can be transmitted in a narrower bandwidth than has heretofore been described. The satellite 25 has been described in connection with the illustrated embodiment as transmitting signals in an L-band downlink. A number of applications, however, may require the prime rate channels to be transmitted in a downlink with less bandwidth (e.g., in the S-band). In accordance with an embodiment of the present invention, error correction is embedded into each broadcast channel by concatenation of a Reed-Solomon (255,223) coder with an interleaver and then with an R-¾ convolutional Viterbi coder. This arrangement yields a broadcast channel having a lower bit rate than the broadcast channel 106 described above in connection with FIG. 4. As described in more detail below, a TDM 1.232 Megasymbol per second (Msym/sec), QPSK modulated symbol stream having a TDM frame period of 138 ms can be transmitted from an uplink broadcast station 23 to radio receivers 29 in the S-band via the transparent payload 133 (FIG. 5) on the satellite 25.

The generation of prime rate channels at broadcast stations 23 is described above in connection with FIG. 4. In accordance with the embodiment of the invention described above in connection with FIGS. 3–8, the prime rate channels are transmitted to the on-board baseband processing payloads 121 of the satellite 25 where the prime rate channels are recovered from FDMA uplinks and switched into L-band TDM downlink bit streams. The broadcast stations 23 employ concatenated coding methods for FEC including a Reed-Solomon (223,255) coder, an interleaver and then a R-½ Viterbi coder.

In accordance with another embodiment of the present invention, the broadcast stations can employ a R-¾ Viterbi encoder as part of FEC protection and format the prime rate channels output therefrom into TDM signals. The TDM signals are then transmitted to the transparent payloads 133 on the satellite 25 for downlink signal transmission to the radio receivers 29.

Figure 29:
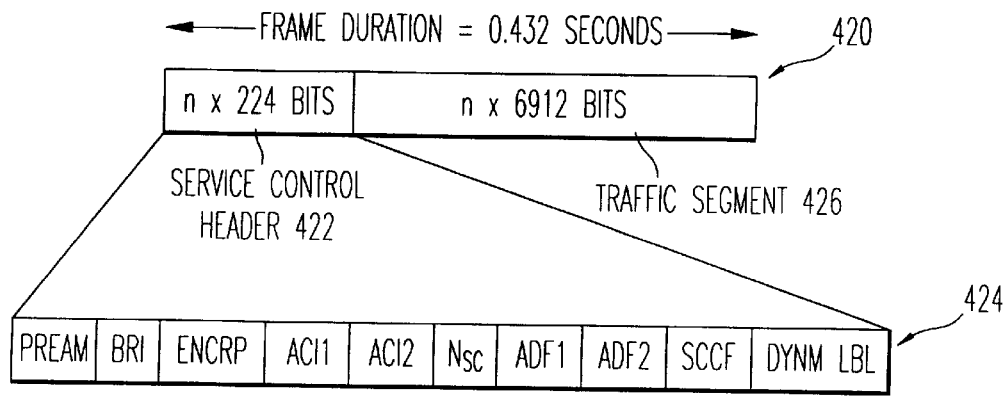
FIG. 29 is a diagram depicting a broadcast channel frame in accordance with an embodiment of the present invention.

The structure of a 432 ms broadcast channel service frame 420 is depicted in FIG. 29. The frame 420 is the same as the frame described above, including a service control header (SCH) 422 comprising the service control header field groups indicated generally at 424 that are described above with reference to Table 1 and the broadcast channel data 426. The broadcast channel data 426 comprises n×prime rate increments of n×6912 bits. With the SCH 422, the broadcast frame 420 comprises n×7136 bits.

The frame 420 in FIG. 29 is the same regardless of whether R-½ or R-¾ convolutional coding is used. Similarly, the use of a Reed-Solomon (223,255) coder and interleaving for the embodiment of the present invention involving R-¾ convolutional coding is the same as that described above in connection with FIG. 3 for the embodiment of the present invention which implements R-½ convolutional encoding. The number of bits per broadcast channel frame is now n×7136×(255/223)=n 8160 bits.

In accordance with the embodiment of the invention using R-¾ convolutional coding, the bits per broadcast channel frame is n×8160/0.75=n×10880 bits per frame 420, as opposed to n×8160/0.5 or n×16320 bits per frame 420 following R-½ convolutional coding. The frame 420 is subsequently demultiplexed into n prime rate channels (PRCs) in a manner similar to the PRCs 110 depicted in FIG. 4; however, a 64-bit header is added, as opposed to the 48 symbol or 96-bit header added to each PRC when R-½ convolutional coding is used. The PRCs therefore have 10944 bits, as opposed to the 16416 bits per PRC when R-½ convolutional coding is used.

Figure 30:
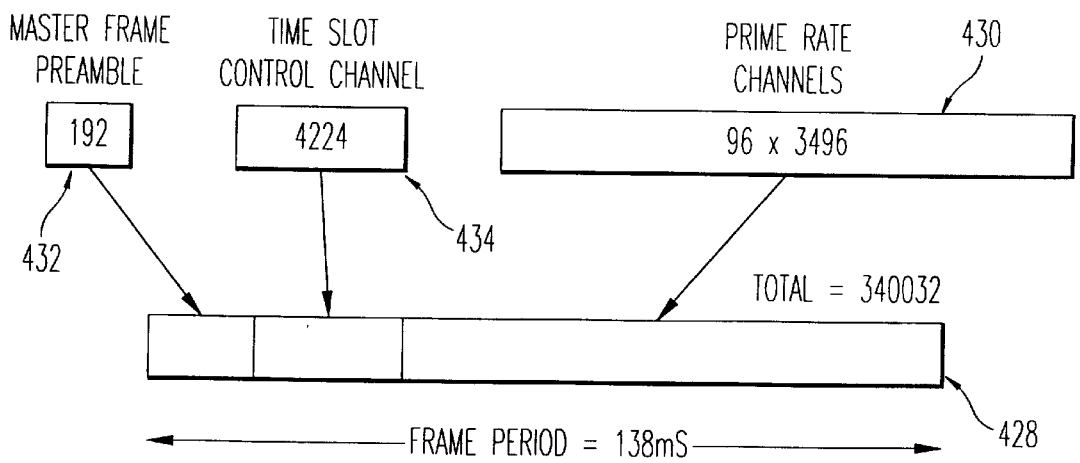
FIG. 30 is a diagram depicting a time division multiplex signal generated in accordance with an embodiment of the present invention.

The broadcast stations are then configured in accordance with the present invention to format a TDM stream using the PRCs. Regardless of whether R-½ convolutional coding with on-board baseband processing or R-¾ convolutional coding with transparent payload transmission is used, the TDM frame period is preferably 138 ms, as shown in FIG. 30. Each PRC is allotted a fraction (i.e., 0.138/0.432) of the PRC bits of each PRC of the frame 420. Thus, each TDM frame 428 carries 96 PRCs 430 having a length of 10944× 0.138/0.432=3496 bits. This is compared with the TDM frame described in connection with FIG. 8 which comprises 96 PRCs having a length of 16416×0.138/0.432 or 5244 bits (FIG. 24). With regard to the 2-bit symbols used for QPSK modulation, each PRC is allowed 1748 symbols, as compared with the 2622 symbols for the embodiment of the invention employing R-½ convolutional coding.

A TDM frame 428 is provided with a 96 symbol or 192 bit master frame preamble (MFP) 432 and a 2112 symbol or 4224 bit time slot control channel (TSCC) 434 such that each TDM frame 428 has 170,016 symbols or 340,032 bits, as compared with the 507,840 symbols (FIG. 24) or 253,920 bits per TDM frame when R-½ convolutional coding is used. The symbol rates for the embodiments of the invention using R-¾ convolutional coding and R-½ convolutional coding, respectively, are 1.232 Msym/sec and 1.84 Msym/sec. Thus, the use of R-¾ convolutional coding reduces the TDM bit rate to 0.6696 of the TDM bit rate achieved using R-½ convolutional encoding.

While certain advantageous embodiments have been chosen to illustrate the invention, it will be understood by those skilled in the art that various changes and modifications can be made therein without departing from the scope of the invention as defined in the appended claims.

What is claimed is:

1. A method of formatting broadcast channels for transmission via satellite to remote receivers in a satellite direct broadcast system comprising the steps of:

framing said broadcast channels into broadcast channel frames, said broadcast channel frames having a selected first period at a broadcast station;

coding said broadcast channel frames using Reed-Solomon coding;

interleaving said broadcast channel frames; and generating time division multiplexed frames having a selected second period of smaller duration than said selected first period using said broadcast channel frames;

wherein said broadcast channel frames correspond to prime rate channels of duration corresponding to said selected first period and comprising two-bit symbols and said generating step for generating time division multiplexed frames further comprises the steps of:

aligning said two-bit symbols in a plurality of said prime rate channels to a time division multiplexed frame symbol clock;

arranging said plurality of said prime rate channels in parallel; and writing said two-bit symbols to at least one of said time division multiplexed frames in groups, corresponding ones of said two-bit symbols in said parallel prime rate channels being arranged serially in said groups, each of said groups comprising a number of said symbols corresponding in number to said parallel prime rate channels.

2. A method as claimed in claim 1, wherein L is approximately 7136 bits and said coding step comprises the step of using a Reed-Solomon (223, 255) coder, said broadcast channel frames each comprising approximately n×7136×(255/223) or n×8160 bits.

3. A method as claimed in claim 2, further comprising the step of:

selecting one of a first convolutional encoder and a second convolutional encoder, said first convolutional encoder and said second convolutional encoder each being operable to receive broadcast channel frames comprising n×L bits per frame where n is an integer number and L corresponds to a predetermined number of input bits from said broadcast channels, and to generate a first number of output bits and a second number of output bits, respectively, said output bits generated by said first convolutional encoder being transmitted to said remote receivers at a first bit rate that is higher than a second bit rate corresponding to said output bits generated by said second convolutional encoder;

wherein said first convolutional encoder and said second convolutional encoder corresponds to a R-½ convolutional encoder and a R-¾ convolutional encoder, respectively, and said broadcast channel frames each comprise approximately n×8160/0.5 or n×16320 bits and approximately 8160/0.75 or n×10880 bits.

4. A method as claimed in claim 3, wherein said framing step comprises the step of generating said broadcast channel frames having an approximately 0.432 second period at a broadcast station, and further comprising the step of generating time division multiplexed frames having an approximately 0.138 second period using said broadcast channel frames.

5. A method as claimed in claim 1, wherein said generating step for generating time division multiplexed frames further comprises the steps of:

adding a master frame preamble to each of said time division multiplexed frames to synchronize a receiver to said time division multiplexed frames;

adding a time slot control channel to each of said time division multiplexed frames to identify the location of said two-bit symbols of each said plurality of prime rate channels in said time division multiplexed frames and a broadcast channel to which said two-bit symbols correspond; and adjusting the rate of said time division multiplexed frame symbol clock to transport said two-bit symbols of corresponding said prime rate channels, said master frame preamble and said time slot control channel in said selected second period.

6. A method of formatting broadcast channels for transmission via satellite to remote receivers in a satellite direct broadcast system comprising the steps of:

framing said broadcast channels into broadcast channel frames;

coding said broadcast channel frames using Reed-Solomon coding;

interleaving said broadcast channel frames; and selecting one of a first convolutional encoder and a second convolutional encoder, said first convolutional encoder and said second convolutional encoder each being operable to receive broadcast channel frames comprising n×L bits per frame where n is an integer number and L corresponds to a predetermined number of input bits from said broadcast channels, and to generate a first number of output bits and a second number of output bits, respectively, said output bits generated by said first convolutional encoder being transmitted to said remote receivers at a first bit rate that is higher than a second bit rate corresponding to said output bits generated by said second convolutional encoder;

wherein L is approximately 7136 bits and said coding step comprises the step of using a Reed-Solomon (223, 255) coder, said broadcast channel frames each comprising approximately n×7136×(255/223) or n×8160 bits;

wherein said first convolutional encoder and said second convolutional encoder corresponds to a R-½ convolutional encoder and a R-¾ convolutional encoder, respectively, and said broadcast channel frames each comprise approximately n×8160/0.5 or n×16320 bits and approximately 8160/0.75 or n×10880 bits;

wherein said framing step comprises the step of generating said broadcast channel frames having an approximately 0.432 second period at a broadcast station, and further comprising the step of generating time division multiplexed frames having an approximately 0.138 second period using said broadcast channel frames; and wherein said broadcast channel frames correspond to 0.432 second prime rate channels comprising two-bit symbols and said generating step for generating time division multiplexed frames further comprises the steps of:

aligning said two-bit symbols in a plurality of said prime rate channels to a time division multiplexed frame symbol clock;

arranging said plurality of said prime rate channels in parallel; and writing said two-bit symbols to at least one of said time division multiplexed frames in groups, corresponding ones of said two-bit symbols in said parallel prime rate channels being arranged serially in said groups, each of said groups comprising a number of said symbols corresponding in number to said parallel prime rate channels.

7. A method as claimed in claim 6, wherein said generating step for generating time division multiplexed frames further comprises the steps of:

adding a master frame preamble to each of said time division multiplexed frames to synchronize a receiver to said time division multiplexed frames;

adding a time slot control channel to each of said time division multiplexed frames to identify the location of said two-bit symbols of each said plurality of said prime rate channels in said time division multiplexed frames and a broadcast channel to which said two-bit symbols correspond; and adjusting the rate of said time division multiplexed frame symbol clock to transport said two-bit symbols of corresponding said prime rate channels, said master frame preamble and said time slot control channel in said 0.138 second period.

* * * * *